(12) United States Patent
Yamaguchi

(10) Patent No.: US 11,056,757 B2
(45) Date of Patent: Jul. 6, 2021

(54) MANUFACTURING METHOD OF A RADIO-FREQUENCY MEMBER

(71) Applicant: Nidec Corporation, Kyoto (JP)

(72) Inventor: Takumi Yamaguchi, Kyoto (JP)

(73) Assignee: NIDEC CORPORATION, Kyoto (JP)

( * ) Notice: Subject to any disclaimer, the term of this patent is extended or adjusted under 35 U.S.C. 154(b) by 101 days.

(21) Appl. No.: 16/585,157

(22) Filed: Sep. 27, 2019

(65) Prior Publication Data

US 2020/0106151 A1 Apr. 2, 2020

(30) Foreign Application Priority Data

Sep. 28, 2018 (JP) .............................. JP2018-185011
Sep. 28, 2018 (JP) .............................. JP2018-185012
Sep. 24, 2019 (JP) .............................. JP2019-172434

(51) Int. Cl.
*H01P 3/123* (2006.01)
*H01P 11/00* (2006.01)
*H01Q 21/00* (2006.01)
*H01L 23/66* (2006.01)

(52) U.S. Cl.
CPC .............. *H01P 3/123* (2013.01); *H01L 23/66* (2013.01); *H01P 11/002* (2013.01); *H01Q 21/0037* (2013.01); *H01L 2223/6627* (2013.01); *H01L 2223/6683* (2013.01)

(58) Field of Classification Search
CPC ........ H01P 3/123; H01P 11/002; H01L 23/66; H01L 2223/6627; H01L 2223/6683; H01Q 1/0037
USPC ....................................................... 333/239
See application file for complete search history.

(56) References Cited

U.S. PATENT DOCUMENTS

| 2005/0088353 A1 | 4/2005 | Irion, II et al. |
| 2011/0187614 A1 | 8/2011 | Kirino et al. |
| 2019/0013589 A1 | 1/2019 | Kamo et al. |
| 2019/0058260 A1 | 2/2019 | Kirino et al. |

FOREIGN PATENT DOCUMENTS

| JP | 2005-014065 A | 1/2005 |
| WO | 2013/126356 A1 | 8/2013 |

OTHER PUBLICATIONS

Yamaguchi, "Antenna Element and Antenna Array", U.S. Appl. No. 16/585,115, filed Sep. 27, 2019.

*Primary Examiner* — Robert J Pascal
*Assistant Examiner* — Kimberly E Glenn
(74) *Attorney, Agent, or Firm* — Keating & Bennett

(57) ABSTRACT

In a manufacturing method of a radio-frequency member in which an inner peripheral surface of a cavity in a die includes a functional-region section that provides the radio-frequency member, a gate opens in a first wall surface of the inner peripheral surface of the cavity, an overflow expands in a direction in which a second wall surface of the inner peripheral surface extends is opened in the second wall surface, the functional-region section is located in a main flow region, the functional-region section includes a plurality of rod forming holes, a distance between edges of openings of at least two rod forming holes is smaller than depths of both of the two rod forming holes, a metal material in a fluid state is injected into the cavity through the gate, and a portion of the metal material flows outside of the cavity from the overflow.

22 Claims, 16 Drawing Sheets

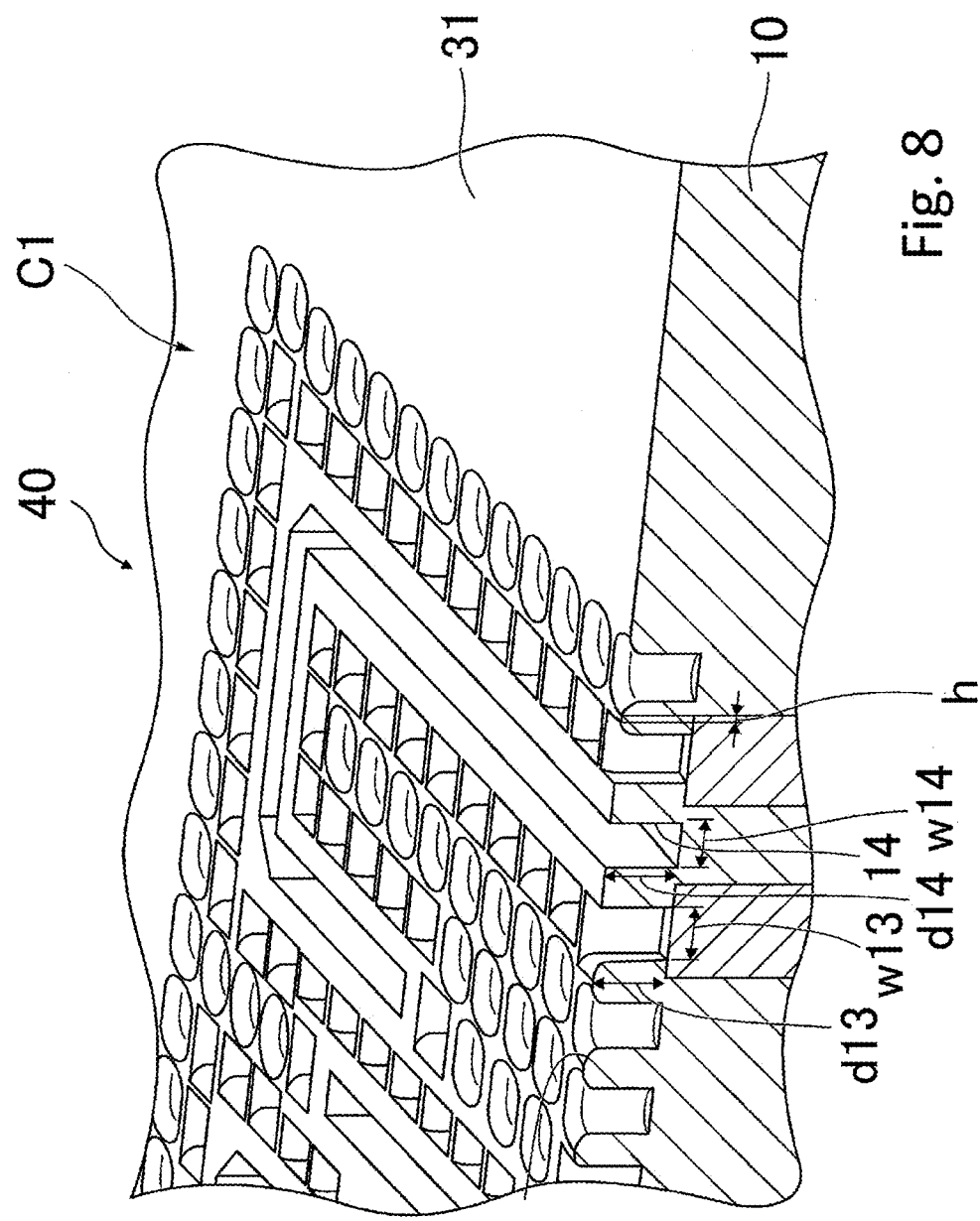

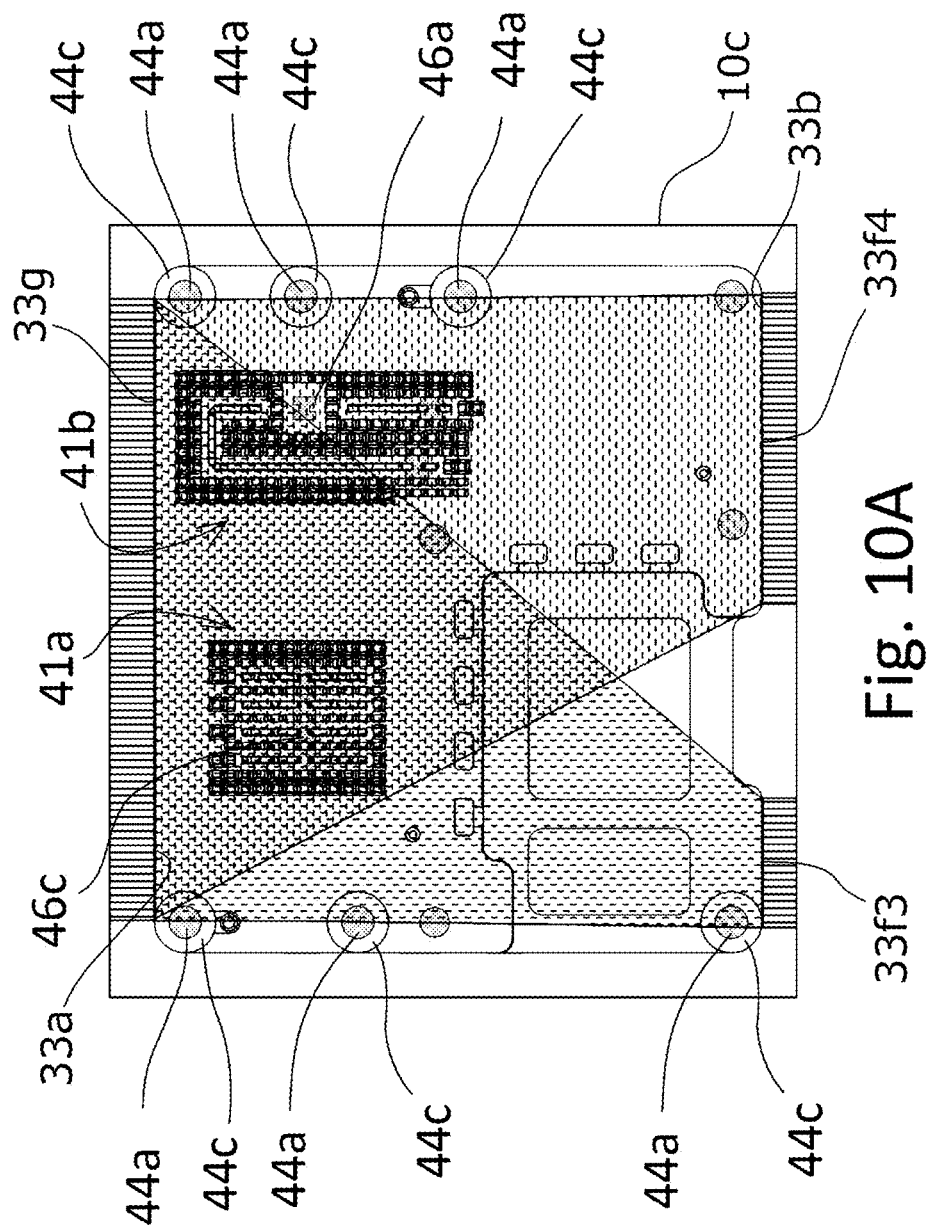

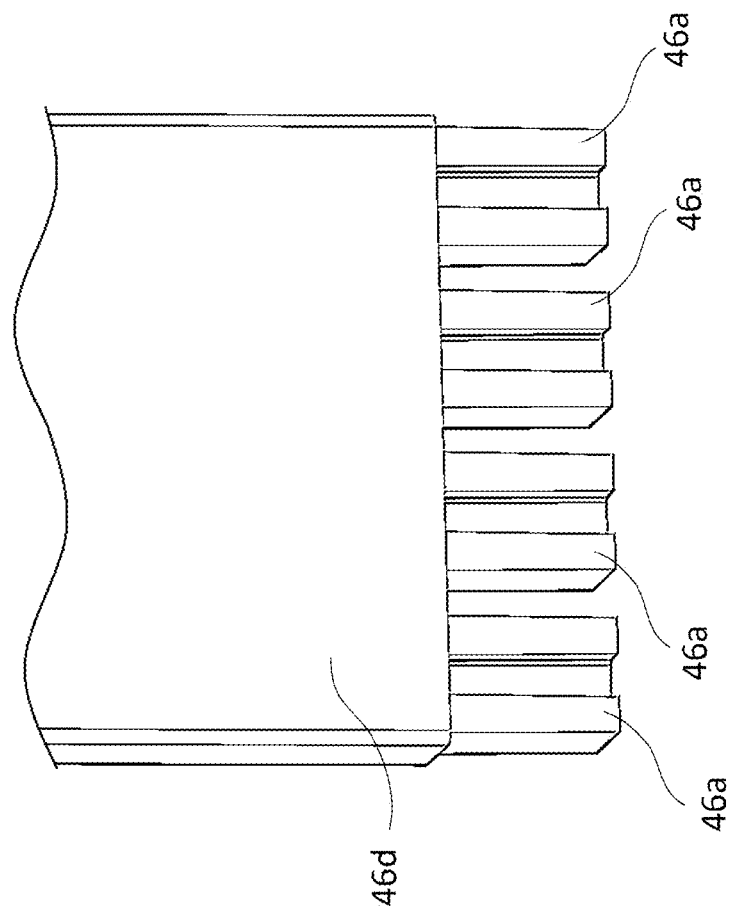

MANUFACTURING METHOD OF A RADIO-FREQUENCY MEMBER

CROSS REFERENCE TO RELATED APPLICATION

The present disclosure claims priority under 35 U.S.C. § 119 to Japanese Application No. 2018-185011 filed on Sep. 28, 2018, Japanese Application No. 2018-185012 filed on Sep. 28, 2018, and Japanese Application No. 2019-172434 filed on Sep. 24, 2019, the entire contents of each application are hereby incorporated herein by reference.

FIELD OF THE INVENTION

The present disclosure relates to a manufacturing method of a radio-frequency member.

BACKGROUND

An example of a waveguide structure including an artificial magnetic conductor is disclosed in International Publication No. WO 2010/050122. The artificial magnetic conductor is a structure that artificially realizes the characteristics of a perfect magnetic conductor (PMC). In a radio-frequency waveguide disclosed in International Publication No. WO 2010/050122, an artificial magnetic conductor in which a plurality of conductive rods arrayed in row and column directions are used is proposed.

As a method of forming, in order to realize an artificial magnetic conductor, a member including structure in which a plurality of conductive rods are arrayed, a manufacturing method involving applying cutting to a metal plate has been used. However, mass production is difficult with the cutting.

SUMMARY

Example embodiments of the present disclosure provide methods of industrially mass-producing radio-frequency members in which an artificial magnetic conductor is used.

A manufacturing method of a radio-frequency member according to an example embodiment of the present disclosure includes preparing a plurality of dies including at least a first die and a second die, combining the first die and the second die to form an internal cavity, injecting a metal material in a fluid state into the cavity, and separating the first die and the second die after the metal material solidifies and taking out a radio-frequency member or an intermediate product of the radio-frequency member. An inner peripheral surface of the cavity includes a top surface, a bottom surface opposed to the top surface, a peripheral wall surface connecting the top surface and the bottom surface and surrounding a space between the top surface and the bottom surface, and a functional-region section provided on at least one surface of the top surface and the bottom surface to define a portion of the radio-frequency member. Further, the peripheral wall surface includes a first wall surface and a second wall surface located on opposite sides of the space from each other, a gate expanding in a direction in which the first wall surface extends is opened in the first wall surface, an overflow expanding in a direction in which the second wall surface extends is opened in the second wall surface, and the functional-region section is located inside a main flow region. The main flow region is a region swept by the gate when the gate is imaginarily linearly moved toward the second wall surface in a state of a plan view of the at least one surface. The functional-region section includes a plurality of holes, at least two holes adjacent to each other among the plurality of holes are rod forming holes each having depth larger than width, a distance between edges of openings of the at least two rod forming holes is smaller than the depths of both of the two rod forming holes, and the metal material in the a fluid state is injected into the cavity through the gate and a portion of the metal material flows to an outside of the cavity from the overflow.

According to example embodiments of the present disclosure, it is possible to mass produce, in an industrial scale, a radio-frequency member in which elements of an artificial magnetic conductor are integrated.

The above and other elements, features, steps, characteristics and advantages of the present disclosure will become more apparent from the following detailed description of the example embodiments with reference to the attached drawings.

BRIEF DESCRIPTION OF THE DRAWINGS

FIG. 8 is a diagram showing, in particular, a dimensional relation among sections of the functional-region section 40 in FIG. 6.

FIG. 10A is a plan view of a first die 10c in another modification of an example embodiment of the present disclosure.

FIG. 12A is a perspective view of a column 46c of a second kind according to an example embodiment of the present disclosure.

DETAILED DESCRIPTION

Manufacturing methods of radio-frequency members according to example embodiments of the present disclosure is explained below with reference to the drawings. The scope of the present disclosure is not limited to the example embodiments explained below and can be optionally changed within the scope of the technical ideas of the present disclosure.

Figure 1:
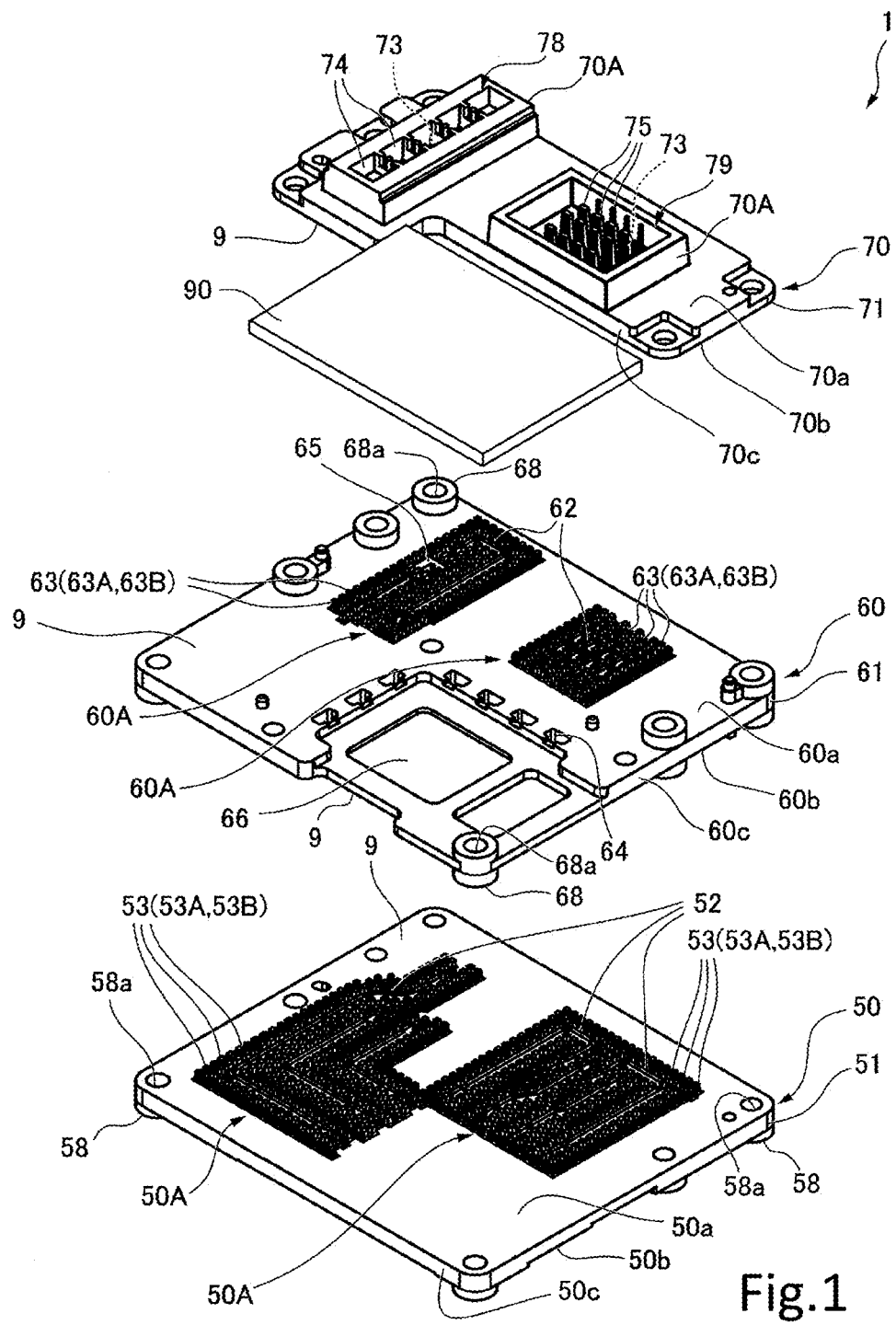
FIG. 1 is an exploded view of an antenna device (a waveguide device) 1 according to an example embodiment of the present disclosure.
Figure 2:
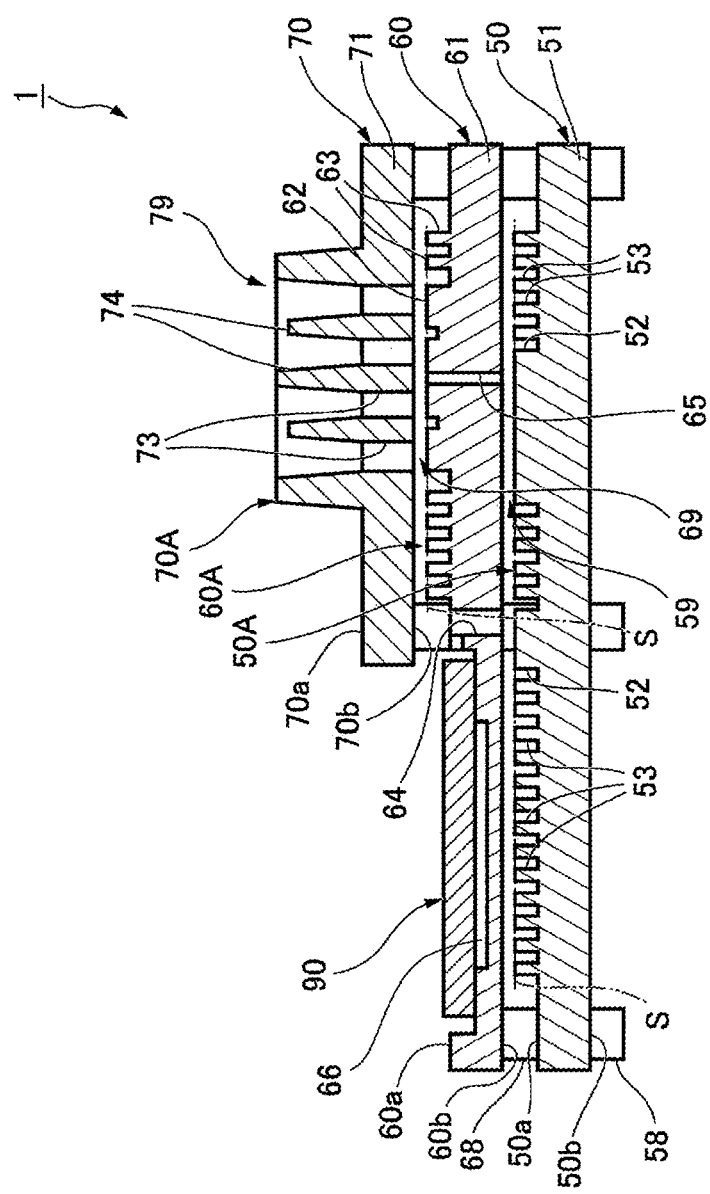
FIG. 2 a schematic sectional view of the antenna device 1 according to an example embodiment of the present disclosure.

FIG. 1 is an exploded view of an antenna device (e.g., a waveguide device) 1 in accordance with an example embodiment of the present disclosure. FIG. 2 is a schematic sectional view of the antenna device 1.

As shown in FIG. 1, the antenna device 1 preferably includes a plurality of radio-frequency members (a first radio-frequency member 50, a second radio-frequency member 60, and a third radio-frequency member 70) and a circuit board 90.

A microwave integrated circuit is mounted on the circuit board 90. The microwave integrated circuit is preferably, for example, an MMIC (Monolithic Microwave Integrated Circuit) that generates or receives a millimeter wave.

In this disclosure, a "radio-frequency member" means a member used to treat and propagate a radio-frequency electromagnetic wave. A "radio frequency" in this description means a frequency of approximately 3 kHz or more and approximately 300 GHz or less. The radio-frequency member in this example embodiment can be used for, for example, propagation of an electromagnetic wave in a millimeter wave band (approximately 30 GHz or more and 300 GHz or less). A frequency band treated by the radio-frequency member may be a band of a frequency lower than the frequency of the millimeter wave or may be a band of a frequency higher than the frequency of the millimeter wave. The radio-frequency member may be used for, for example, propagating an electromagnetic wave in a terahertz wave band (approximately 300 GHz or more and approximately 3 THz or less). The structure of the radio-frequency member is not limited to this example embodiment and can be widely applied for uses in which an artificial magnetic conductor including structure in which a plurality of conductive rods are arrayed is adopted.

In this example embodiment, the circuit board 90 is preferably disposed and fixed on the second radio-frequency member 60. However, note that the circuit board 90 only has to be disposed on one or more of the plurality of radio-frequency members 50, 60, and 70.

The first radio-frequency member (radio-frequency member) 50, the second radio-frequency member (radio-frequency member) 60, and the third radio-frequency member (radio-frequency member) 70 are conductive members. That is, the first radio-frequency member 50, the second radio-frequency member 60, and the third radio-frequency member 70 are preferably made of a conductive metal material. As an example, the first radio-frequency member 50, the second radio-frequency member 60, and the third radio-frequency member 70 can be made of a magnesium alloy. But other alloys, including aluminum alloys and zinc alloys for example, can be also used. As explained below, the first radio-frequency member 50, the second radio-frequency member 60, and the third radio-frequency member 70 are manufactured by die casting.

The first radio-frequency member 50, the second radio-frequency member 60, and the third radio-frequency member 70 are preferably plate-shaped. The first radio-frequency member 50, the second radio-frequency member 60, and the third radio-frequency member 70 are stacked along the thickness directions thereof with the thickness directions aligned. The second radio-frequency member 60 is disposed between the first radio-frequency member 50 and the third radio-frequency member 70.

When the antenna device 1 is disposed in this posture, the antenna device 1 transmits an electromagnetic wave upward from the upper side and receives an electromagnetic wave transmitted downward to the upper side and reaching the antenna device 1.

In this disclosure, in order to facilitate explanation, the up-down direction is defined so that the first radio-frequency member 50, the second radio-frequency member 60, and the third radio-frequency member 70 are disposed with the thickness directions thereof aligned with the up-down direction. The first radio-frequency member 50, the second radio-frequency member 60, and the third radio-frequency member 70 are disposed from the lower side to the upper side in this order under the above explained definition. Note that any structure appearing in a figure of the present application is shown in an orientation that is selected for ease of explanation, which in no way should limit its orientation when an example embodiment of the present disclosure is actually practiced. Also note that any direction described in the specification of the present application is described for ease of explanation, which in no way should limit its orientation when an example embodiment of the present disclosure is actually practiced. Moreover, the shape and size of a whole or a part of any structure that is shown in a figure should not limit its actual shape and size.

In this example embodiment, the first radio-frequency member 50, the second radio-frequency member 60, and the third radio-frequency member 70 are made of the metal material. Therefore, the entire surfaces of the first radio-frequency member 50, the second radio-frequency member 60, and the third radio-frequency member 70 have conductivity. That is, the first radio-frequency member 50, the second radio-frequency member 60, and the third radio-frequency member 70 have conductive surfaces 9. In this example embodiment, the configurations of the first radio-frequency member 50, the second radio-frequency member 60, and the third radio-frequency member 70 are explained assuming that the conductive surfaces 9 are provided on upper surface and lower surface sides of the first radio-frequency member 50, the second radio-frequency member 60, and the third radio-frequency member 70.

As shown in FIG. 2, a first waveguide 59 is provided between the first radio-frequency member 50 and the second radio-frequency member 60. A second waveguide 69 is provided between the second radio-frequency member 60 and the third radio-frequency member 70. That is, the waveguides 59 and 69 are respectively provided between the first radio-frequency member 50 and the second radio-frequency member 60 and between the second radio-frequency member 60 and the third radio-frequency member 70.

In this description, the waveguides 59 and 69 are preferably WRG waveguides (Waffle Iron Ridge Waveguides (WRGs)) in which an artificial magnetic conductor and a ridge (a waveguide member) are disposed between two radio-frequency members 50 and 60. The waveguides 59 and 69 can realize an antenna power feeding path with a low loss in a microwave or a millimeter wave band. The first radio-frequency member 50 and the second radio-frequency member 60 define and function as power feeding layers that excite and distribute an electromagnetic wave and supply the electromagnetic wave to a radiation layer.

The third radio-frequency member 70 includes an antenna array 78 used to transmit an electromagnetic wave and an antenna array 79 used to receive an electromagnetic wave. The antenna arrays 78 and 79 of the third radio-frequency member 70 are coupled to the waveguides 59 and 69. The third radio-frequency member 70 in this example embodiment functions a radiation layer for transmitting and receiving an electromagnetic wave.

According to this example embodiment, it is possible to manufacture the antenna device 1 in which a radiation layer and a power feeding layer are provided by stacking and disposing a plurality of radio-frequency members in which functional regions are respectively provided. That is, according to this example embodiment, it is possible to realize a flat panel antenna device that is flat and low profile as a whole.

The respective radio-frequency members 50, 60, and 70 are explained below more in detail.

As shown in FIG. 1, the first radio-frequency member 50 includes a plate-shaped main body section 51. The main body section 51 of the first radio-frequency member 50 preferably includes an upper surface 50a and a lower surface 50b facing away from each other. The main body section 51 further includes a peripheral wall surface 50c that connects the upper surface 50a and the lower surface 50b.

In this description, all of main body sections 51, 61, and 71 of the respective radio-frequency members 50, 60, and 70 have surfaces facing the upper side and surfaces facing the lower side. The upper surface 50a of the first radio-frequency member 50 and a lower surface 60b of the second radio-frequency member 60 are opposed in the up-down direction. An upper surface 60a of the second radio-frequency member 60 and a lower surface 70b of the third radio-frequency member 70 are opposed in the up-down direction.

As shown in FIG. 2, a ridge 52 extending in a stripe shape when viewed from the up-down direction and a plurality of rods 53 disposed around the ridge 52 when viewed from the up-down direction are provided on the upper surface 50a of the first radio-frequency member 50. That is, the first radio-frequency member 50 includes the ridge 52 and the rods 53. Both of the ridge 52 and the rods 53 project to the upper side from the upper surface 50a of the main body section 51.

The upper end surface of the ridge 52 of the first radio-frequency member 50 is opposed to the lower surface 60b of the second radio-frequency member 60 via a gap in the up-down direction. The gap between the upper end surface of the ridge 52 and the lower surface 60b of the second radio-frequency member 60 defines the first waveguide 59. An electromagnetic wave (a signal wave) propagates, along a direction in which the ridge 52 extends, in the gap between the upper end surface of the ridge 52 and the lower surface 60b of the second radio-frequency member 60. The ridge 52 extends at a uniform width along a direction in which the electromagnetic wave is guided.

The plurality of rods 53 are arrayed in a row direction and a column direction around the ridge 52. Such rods 53 are sometimes called posts or pins. The plurality of rods 53 arrayed in the row and column directions provide an artificial magnetic conductor.

The artificial magnetic conductor is a structure that artificially realizes the characteristics of a perfect magnetic conductor (PMC) which does not exist in the natural world. The perfect magnetic conductor has a characteristic that "a tangential component of a magnetic field on the surface is zero". This is a characteristic opposite to the characteristic of a perfect electric conductor (PEC), that is, a characteristic "a tangential component of an electric field on the surface is zero". The perfect magnetic conductor is absent in the natural world but can be realized by an artificial structure such as an array of a plurality of conductive rods. The artificial magnetic conductor defines and functions as a perfect magnetic conductor in a specific frequency band decided by the structure of the artificial magnetic conductor. The artificial magnetic conductor suppresses or inhibits an electromagnetic wave having a frequency included in the specific frequency band (a propagation inhibition band) from propagating along the surface of the artificial magnetic conductor. Therefore, the surface of the artificial magnetic conductor is sometimes called high-impedance surface.

The upper end surfaces of the plurality of rods 53 are opposed to the lower surface 60b of the second radio-frequency member 60 via a gap in the up-down direction. In this example embodiment, the upper end surfaces of the plurality of rods 53 are located on the same plane as the upper end surface of the ridge 52. The plane defines a surface S of the artificial magnetic conductor.

The ridge 52 is disposed between the plurality of rods 53 when viewed from the thickness direction of the first radio-frequency member 50. That is, the artificial magnetic conductors are respectively located on both sides in the width direction of the ridge 52. In other words, both the sides in the width direction of the ridge 52 are sandwiched by the artificial magnetic conductors.

In this example embodiment, the ridge 52 and the rods 53 preferably have the same height. However, the height of the ridge 52 may be different from the height of the rods 53.

On both the sides in the width direction of the ridge 52, a space between the surface S of the artificial magnetic conductor and the lower surface 60b of the second radio-frequency member 60 does not allow the electromagnetic wave having the frequency within the specific frequency band to propagate. Such a frequency band is called "prohibition band". A frequency (that is, an operating frequency) of an electromagnetic wave (a signal wave) propagating through the first waveguide 59 provided between the upper end surface of the ridge 52 and the lower surface 60b of the second radio-frequency member 60 is included in the prohibition band. Therefore, the antenna device 1 is able to suppress a loss of the electromagnetic wave propagating through the first waveguide 59.

The ridge 52 of the first radio-frequency member 50 preferably includes a pair of end portions when viewed from the thickness direction. The pair of end portions of the ridge 52 is respectively located right below ports 64 and 65 (through-holes) provided in the second radio-frequency member 60. One of the pair of end portions of the ridge 52 is opposed to, via the first port 64, a terminal (not shown in FIG. 2) of the circuit board 90 disposed on the upper surface 60a of the second radio-frequency member 60. The other of the pair of end portions of the ridge 52 is disposed right below the second port 65. The first waveguide receives an electromagnetic wave from the terminal of the circuit board 90 via the first port 64 and passes the electromagnetic wave to the second waveguide 69 via the second port 65.

As shown in FIG. 1, two regions where a plurality of ridges 52 and the plurality of rods 53 are concentratedly disposed when viewed from the thickness direction are provided on the upper surface 50a of the first radio-frequency member 50. In this description, the regions where the plurality of ridges 52 and the plurality of rods 53 are concentratedly disposed are called functional regions 50A. One of the two functional regions 50A is provided to propagate an electromagnetic wave (a transmission signal) to be transmitted. The other is provided to propagate an electromagnetic wave (a reception signal) to be received.

Figure 3:
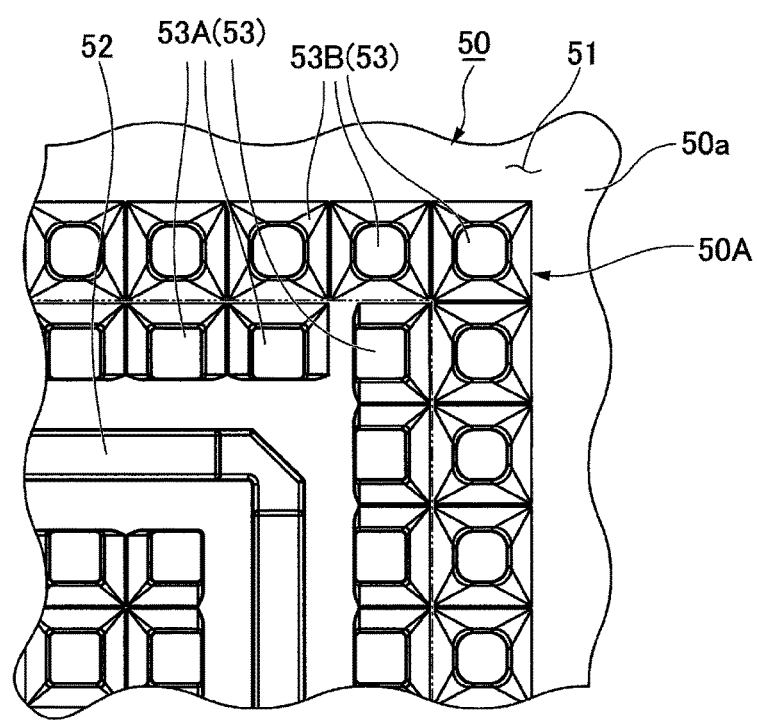
FIG. 3 is a partially enlarged view of a first radio-frequency member according to an example embodiment of the present disclosure.

FIG. 3 is a partially enlarged view of the first radio-frequency member 50.

The plurality of rods 53 are categorized into first kind of rods 53A and second kind of rods 53B, the first kind of rods 53A may have different shapes from the second kind of rods 53B. The first kind of rods 53A are the rods 53 adjacent to the ridge 52 when viewed from the thickness direction. The plurality of the first kind of rods 53A are arranged along a direction in which the ridge 52 extends. On the other hand, the second kind of rods 53B are disposed farther on the outer side than the first kind of rods 53A with respect to the ridge 52 when viewed from the thickness direction.

In the following explanation, when the first kind of rods 53A and the second kind of rods 53B are not distinguished from each other, the first kind of rods 53A and the second kind of rods 53B are simply referred to as rods 53.

To define the artificial magnetic conductor around the ridge 52, a highly accurate shape of the first kind of rods 53A disposed adjacent to the ridge 52 is important. More specifically, a rod 53a including a clearer edge on the ridge 52 side of the tip thereof is more functional to provide an artificial magnetic conductor with better performance. On the other hand, the second kind of rods 53B are arranged to support the function of the first kind of rods 53A. Contribution of the second kind of rods 53B for a performance of the artificial magnetic conductor is smaller than that of the first kind of rods 53A. Therefore, it is preferable that edges on the ridge 52 side of the first kind of rods 53A are clearer than the other edges of the first kind of rods 53A and the edges of the second kind of rods 53B. "Clear" in this case means that a curvature radius at the portion is small.

A plurality of fixing sections 58 projecting to the lower side are provided on the lower surface 50b of the first radio-frequency member 50. The fixing sections 58 are preferably columnar in shape. The plurality of fixing sections 58 are provided along the peripheral wall surface 50c on the lower surface 50b. Fixing holes 58a penetrating through the fixing sections 58 in the up-down direction are provided in the fixing section 58. Screws for fixing the radio-frequency members 50, 60, and 70 to one another are inserted into the fixing holes 58a.

As shown in FIG. 1, the second radio-frequency member 60 includes a main body section 61. The main body section 61 of the second radio-frequency member 60 preferably includes the upper surface 60a and the lower surface 60b facing away from each other. The main body section 61 includes a peripheral wall surface 60c that connects the upper surface 60a and the lower surface 60b.

Like the first radio-frequency member 50, the second radio-frequency member 60 functions as a power feeding layer. The second radio-frequency member 60 preferably has a configuration similar to the configuration of the first radio-frequency member 50.

As shown in FIG. 2, a ridge 62 (a waveguide member) extending in a stripe shape when viewed from the up-down direction and a plurality of rods 63 disposed around the ridge 62 when viewed from the up-down direction are provided on the upper surface 60a of the second radio-frequency member 60. That is, the second radio-frequency member 60 includes the ridge 62 and the rods 63. Both of the ridge 62 and the rods 63 project to the upper side from the upper surface 60a of the main body section 61.

The upper end surface of the ridge 62 of the second radio-frequency member 60 is opposed to the lower surface 70b of the third radio-frequency member 70 via a gap in the up-down direction. The gap between the upper end surface of the ridge 62 and the lower surface 70b of the third radio-frequency member 70 constitutes the second waveguide 69.

The ridge 62 of the second radio-frequency member 60 includes a pair of end portions when viewed from the thickness direction. One of the pair of end portions of the ridge 62 is disposed adjacent to the second port 65 of the second radio-frequency member 60. The other of the pair of end portions of the ridge 62 is located right below slots (through-holes) 73 provided in the third radio-frequency member 70. The second waveguide 69 receives an electromagnetic wave from the first waveguide 59 via the second port 65 and passes the electromagnetic wave to the antenna array 79 of the third radio-frequency member 70 via the slots 73.

Like the rods 53 of the first radio-frequency member 50, the rods 63 of the second radio-frequency member 60 are preferably categorized into two kinds of rods. That is, the plurality of rods 63 are categorized into a plurality of first kind of rods 63A and a plurality of second kind of rods 63B.

The first kind of rod 63A preferably has the same configuration as the configuration of the first kind of rod 53A (see FIG. 3) of the first radio-frequency member 50. That is, the first kind of rods 63A are the rods 63 adjacent to the ridge 62 when viewed from the thickness direction. The plurality of first kind of rods 63A are arranged along a direction in which the ridge 62 extends.

In the following explanation, when the first kind of rods 63A and the second kind of rods 63B are not distinguished from each other, the first kind of rods 63A and the second kind of rods 63B are simply referred to as rods 63.

The second kind of rods 63B preferably has the same configuration as the second kind of rods 53B (see FIG. 3) of the first radio-frequency member 50. That is, the second kind of rods 63B are disposed farther on the outer side than the first kind of rods 63A with respect to the ridge 62.

As shown in FIG. 1, two functional regions 60A in which a plurality of ridges 62 and the plurality of rods 63 are concentratedly disposed when viewed from the thickness direction are provided on the upper surface 60a of the second radio-frequency member 60. One of the two functional regions 60A is provided to propagate an electromagnetic wave (a transmission signal) to be transmitted and the other is provided to propagate an electromagnetic wave (a reception signal) to be received.

As shown in FIG. 2, the circuit board 90 is preferably disposed on the upper surface 60a of the second radio-frequency member 60. A microwave integrated circuit is mounted on a surface of the circuit board 90 on a side opposed to the upper surface 60a of the second radio-frequency member 60, that is, the rear side of the circuit board 90 in FIG. 2. Since the microwave integrated circuit is present on the rear side of the circuit board 90, the microwave integrated circuit is not shown in FIG. 2. A recess 66 is present on the upper surface 60a of the second radio-frequency member 60. The recess 66 defines and functions as an integrated circuit accommodating region 66. A plurality of first ports 64 (through-holes) and a plurality of second ports 65 (through-holes) penetrating through the second radio-frequency member 60 in the thickness direction are provided in the second radio-frequency member 60. The plurality of first ports 64 are disposed side by side around the integrated circuit accommodating region 66. The second ports 65 are located on the inner side of the functional region 60A when viewed from the thickness direction.

A plurality of fixing sections 68 projecting up or down are provided on the upper surface 60a and the lower surface 60b of the second radio-frequency member 60. The fixing sections 68 are preferably columnar. The plurality of fixing sections 68 are provided along the peripheral wall surface 60c on the upper surface 60a and the lower surface 60b. Fixing holes 68a penetrating through the fixing sections 68 in the up-down direction are provided in the fixing sections 68. Screws for fixing the radio-frequency members 50, 60, and 70 to one another are inserted into the fixing holes 68a.

The third radio-frequency member 70 includes a main body section 71. The main body section 71 of the third radio-frequency member 70 includes an upper surface 70a and the lower surface 70b facing opposite directions each other. The main body section 71 further includes a peripheral wall surface 70c that connects the upper surface 70a and the lower surface 70b.

The third radio-frequency member 70 includes the antenna array 78 and the antenna array 79 on the upper surface 70a. The horn antenna array 78 preferably includes a plurality of slots 73 and horns 74 respectively connected to the slots 73. The antenna array 79 includes a plurality of slots 73 and protrusions 75 extending from openings of the slots 73.

The slots 73 are through-holes penetrating through the main body section 71 of the third radio-frequency member 70 in the up-down direction. The slots 73 are respectively opened in the upper surface 70a and the lower surface 70b of the main body section 71. The slots 73 define and function as power feeding slots that feed an electromagnetic wave. The slots 73 are connected to the second waveguide 69. That is, the slots 73 receive an electromagnetic wave from the second waveguide 69.

The antenna array 78 includes five horns 74 arranged in a row. The slots 73 are opened in bottom sections of three horns 74 in the center among the five horns 74. In this case, "the slots 73 are opened" means that the slots 73 and the horns 74 are in a relation in which the slots 73 and the horns 74 are capable of transmitting and receiving a radio wave. For example, even if the slots 73 are closed by a dielectric, if the slots 73 are capable of transmitting and receiving an electromagnetic wave, the slots are treated as being opened in the radio-frequency member according to an example embodiment of the present disclosure.

Manufacturing Method of the Radio-Frequency Members

A manufacturing method of the radio-frequency members 50, 60, and 70 according to an example embodiment of the preset disclosure will now be explained. The radio-frequency members 50, 60, and 70 are preferably molded by a die 2 in a die casting method.

Figure 4:
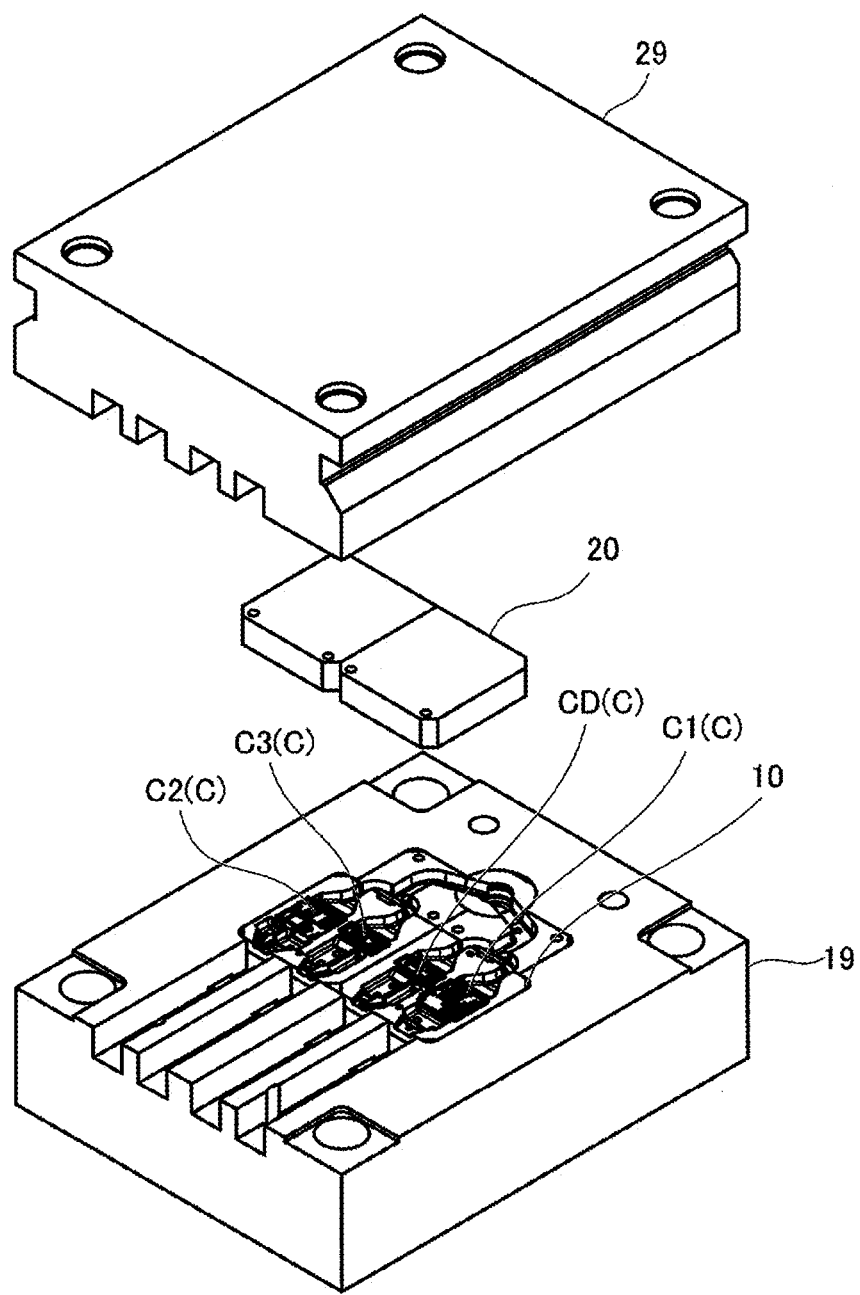
FIG. 4 is an exploded perspective view of a die (a die casting die) 2 used in molding radio-frequency members 50, 60, and 70 according to an example embodiment of the present disclosure.

FIG. 4 is an exploded perspective view of the die (a die casting die) 2 used in molding the radio-frequency members 50, 60, and 70.

The die 2 includes a first mold (a first die) 10, a first support 19, a second mold (a second die) 20, and a second support 29. That is, the die 2 preferably includes a plurality of dies including at least the first mold 10 and the second mold 20.

The first mold 10 and the second mold 20 are disposed to face each other. The first mold 10 is supported by the first support 19. The first support 19 and the second support 29 are respectively held by a not-shown mechanism. The mechanism can move the second support 29 relatively to the first support 19 in a direction in which the second support 29 separates from the first support 19 or a direction in which the second support 29 approaches the first support 19. Operations in bringing dies close to each other and combining the dies is hereinafter sometimes referred to as "closing the dies". Operations in separating the dies from a closed state is hereinafter sometimes represented as "opening the dies". A direction in which the dies are moved in the opening and closing operation is sometimes represented as an opening and closing direction.

In FIG. 4, the second mold 20 and the second support 29 are shown in a separated state. However, in actual molding work, the second mold 20 is fixed to the second support 29.

In a state in which the first mold 10 and the second mold 20 are brought into contact and combined, cavities C are present between the first mold 10 and the second mold 20. This state is hereinafter sometimes represented as a state in which the dies are closed. Operations in this case are sometimes represented as "closing the dies". The number of cavities C is sometimes one. However, in this example, the number of cavities C is four. In order to improve productivity, a plurality of cavities C are preferably used.

By closing the dies, the cavities C are defined by the first mold 10 and the second mold 20. The cavities C are hollows surrounded by the first mold 10 and the second mold 20. The inner peripheral surfaces of the cavities C are parts of the surface of each of the first mold 10 and the second mold 20.

The first mold 10 and the second mold 20 may be defined by a plurality of partial dies, inserts, or the like.

In this description, the cavities C indicate spaces that mold the radio-frequency members 50, 60, and 70 and do not include a space for forming a runner and an overflow.

A metal material melted and in a fluid state is injected into the cavities C. The injected metal material solidifies, whereby the radio-frequency members 50, 60, and 70 are molded. That is, the manufacturing method of the radio-frequency members 50, 60, and 70 includes a step of injecting the metal material into the cavities C in the fluid state and solidifying the metal material.

In this example embodiment, in addition to the cavities C for respectively molding the first radio-frequency member 50, the second radio-frequency member 60, and the third radio-frequency member 70, the cavity C that molds a dummy molded article that improves a balance of flow of the melted metal material is provided in the die 2. Therefore, four cavities are provided in the die 2. The four cavities C are categorized into a first cavity C1 that molds the first radio-frequency member 50, a second cavity C2 that molds the second radio-frequency member 60, a third cavity C3 that molds the third radio-frequency member 70, and a dummy cavity CD for molding the dummy molded article. A fourth cavity that molds a fourth radio-frequency member may be provided instead of the dummy cavity CD.

The manufacturing method of the radio-frequency members 50, 60, and 70 includes a step of, after the metal material injected into the cavities C solidifies, opening the die 2 and taking out the solidified metal material. In this example embodiment, the solidified metal material has a form in which a runner and an overflow are coupled to the radio-frequency members 50, 60, and 70. In this example embodiment, the solidified metal material (a molded body) is an intermediate product and is not a completed product of the radio-frequency members 50, 60, and 70. The manufacturing method of the radio-frequency members 50, 60, and 70 in this example embodiment includes a step of removing the runner and the overflow from the intermediate product taken out from the die 2.

The runner and the overflow may be removed in the step of separating the first mold 10 and the second mold 20. In this case, the metal material taken out in the step of separating the first mold 10 and the second mold 20 can be the radio-frequency members 50, 60, and 70 themselves.

In this description, metal in a fluid state is sometimes simply referred to as melted metal to simplify the following description. In the present disclosure, the melted metal is not limited to metal completely melted to be in a single phase state of a liquid phase. Even in a state in which a solid phase of the material partially remains and the solid phase and the liquid phase coexist, if the melted metal is in a flowable state as a whole, the melted metal is included in a category of "the metal material melted and in the fluid state". As an example, a material in which the solid phase and the liquid phase coexist to show thixotropy can also be "the metal material melted and in the fluid state" in the present disclosure.

Specific structure of the die 2 in this example embodiment is explained below. The first cavity C1 among the plurality of cavities C and the first radio-frequency member 50 molded in the first cavity C1 are explained.

Figure 5:
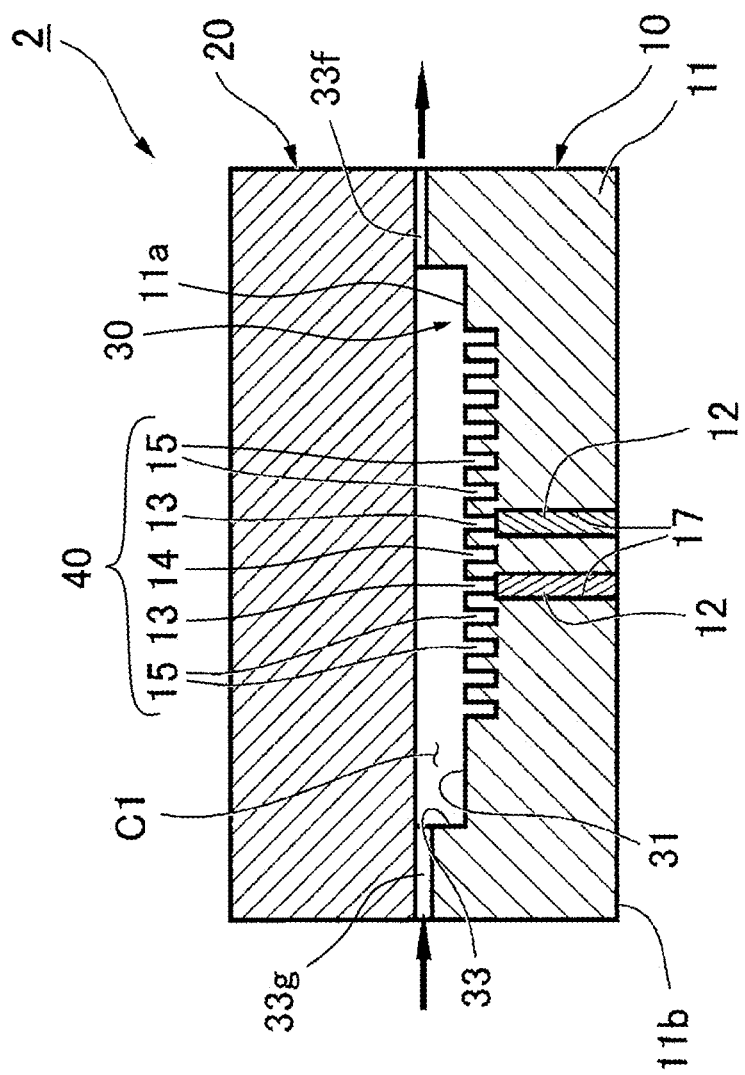
FIG. 5 is a schematic sectional view of a first die 10 and a second die 20 according to an example embodiment of the present disclosure.

FIG. 5 is a schematic sectional view of the first mold 10 and the second mold 20. The first mold 10 and the second mold 20 are combined and the first cavity C1 is defined. Melted metal is filled in the first cavity C1 and solidifies, whereby the first radio-frequency member 50 is molded.

The first mold 10 preferably includes a base 11 having a block shape and a plurality of inserts 12 attached to the base 11. More accurately, the base 11 has a rectangular parallelepiped shape or a plate shape in which a plurality of grooves, recesses, and through-holes are provided.

The base 11 includes a first surface 11a and a second surface 11b facing the opposite side of the first surface 11a. The first surface 11a is opposed to the second mold 20. When the die 2 is opened, the distance between the first surface 11a and the second mold 20 increases. A main recess 30 opened on the second mold 20 side, a gate 33g connected to the main recess 30, and an overflow 33f connected to the main recess 30 are provided on the first surface 11a. The lengths of the gate 33g and the overflow 33f in the depth direction in FIG. 5 is larger than the depths thereof. The gate 33g and the overflow 33f are holes opened in the cavities C in a state in which the die 2 is closed.

In the state in which the die 2 is closed, the opening of the main recess 30 is covered by the second mold 20. That is, a part of the surface of the second mold 20 is opposed to the first surface 11a and the main recess 30. The first cavity C1 is a space surrounded by the main recess 30 and the second mold 20. The main recess 30 includes a bottom surface 31 opposed to the second mold 20 and wall surfaces 33a and 33b extended to the second mold 20 side from the bottom surface 31.

The bottom surface 31 of the main recess 30 is a portion of the first surface 11a of the base 11.

The base 11 preferably includes a plurality of stripe-shaped recesses 14, a plurality of through-holes 13, a plurality of first recesses 15, and a not-shown plurality of second recesses. All of the recesses are opened in the bottom surface 31 of the main recess 30. The base 11 includes a plurality of accommodating recesses 17. The accommodating recesses 17 are respectively opened in the second surface 11b and recessed toward the first surface 11a. Each of the plurality of through-holes 13 is opened in the first surface 11a. Each of the through-holes 13 extends from the first surface 11a and reaches the accommodating recess 17 and is opened in a bottom surface 171 of the accommodating recess 17. In general, the base 11 includes at least one stripe-shaped recess 14 and at least one accommodating recess 17.

Figure 6:
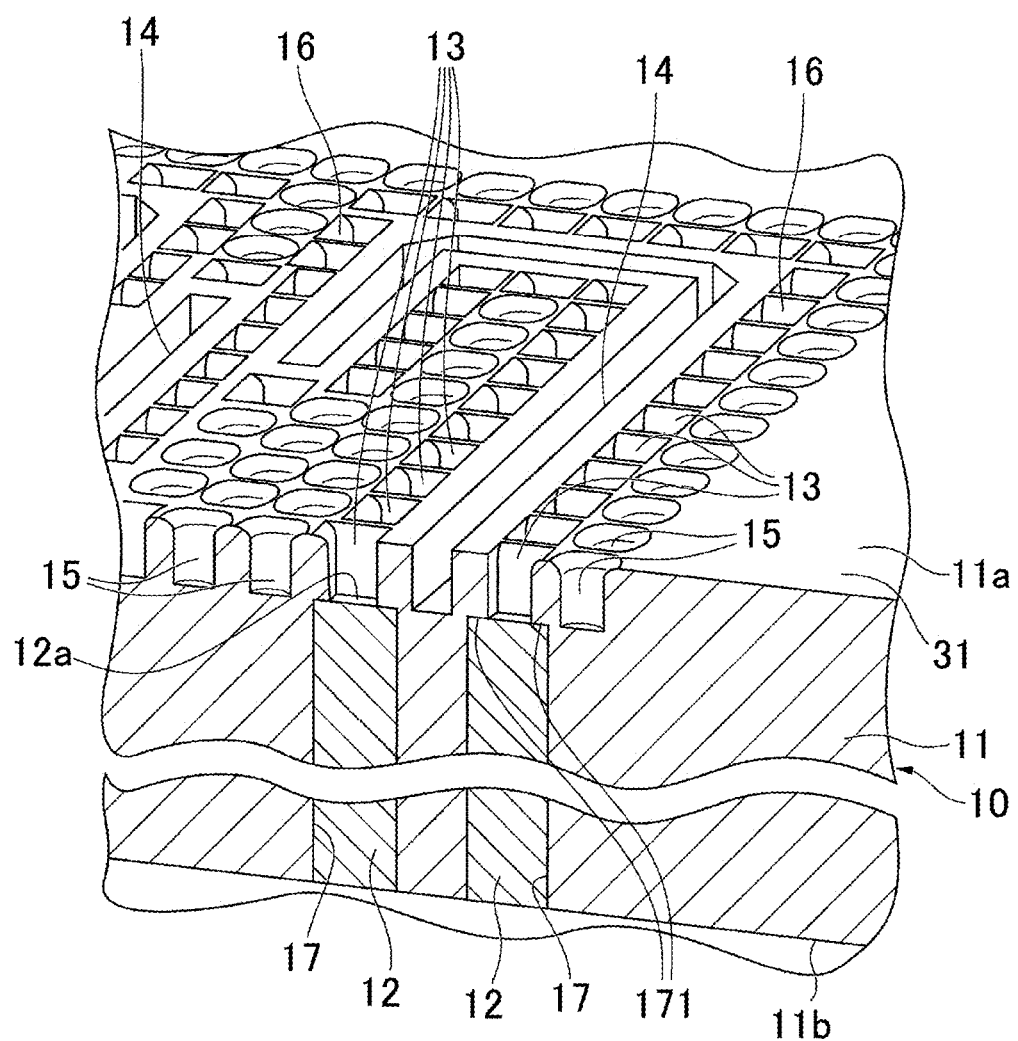
FIG. 6 is a partial sectional perspective view of the first die 10.

FIG. 6 is a partial sectional perspective view of the first mold 10 in the first cavity C1.

As shown in FIG. 6, the base 11 includes a plurality of second recesses 16 in addition to the plurality of stripe-shaped recesses 14, the plurality of through-holes 13, the plurality of accommodating recesses 17, and the plurality of first recesses 15.

The stripe-shaped recesses 14 are opened in the bottom surface 31 of the main recess 30. The stripe-shaped recesses 14 recess from the first surface 11a toward the second surface 11b side. The length of the stripe-shaped recesses 14 is larger than a triple of the width thereof. The stripe-shaped recesses 14 could include bending sections and branches. The melted metal material is filled in the internal spaces of the stripe-shaped recesses 14 and solidifies, whereby the ridges 52 are molded.

The accommodating recesses 17 are opened in the second surface 11b of the base 11. The accommodating recesses 17 recess from the second surface 11b toward the first surface 11a side. The inserts 12 are respectively housed in the plurality of accommodating recesses 17. In this case, the inserts 12 are fit in the accommodating recesses 17.

Figure 7:
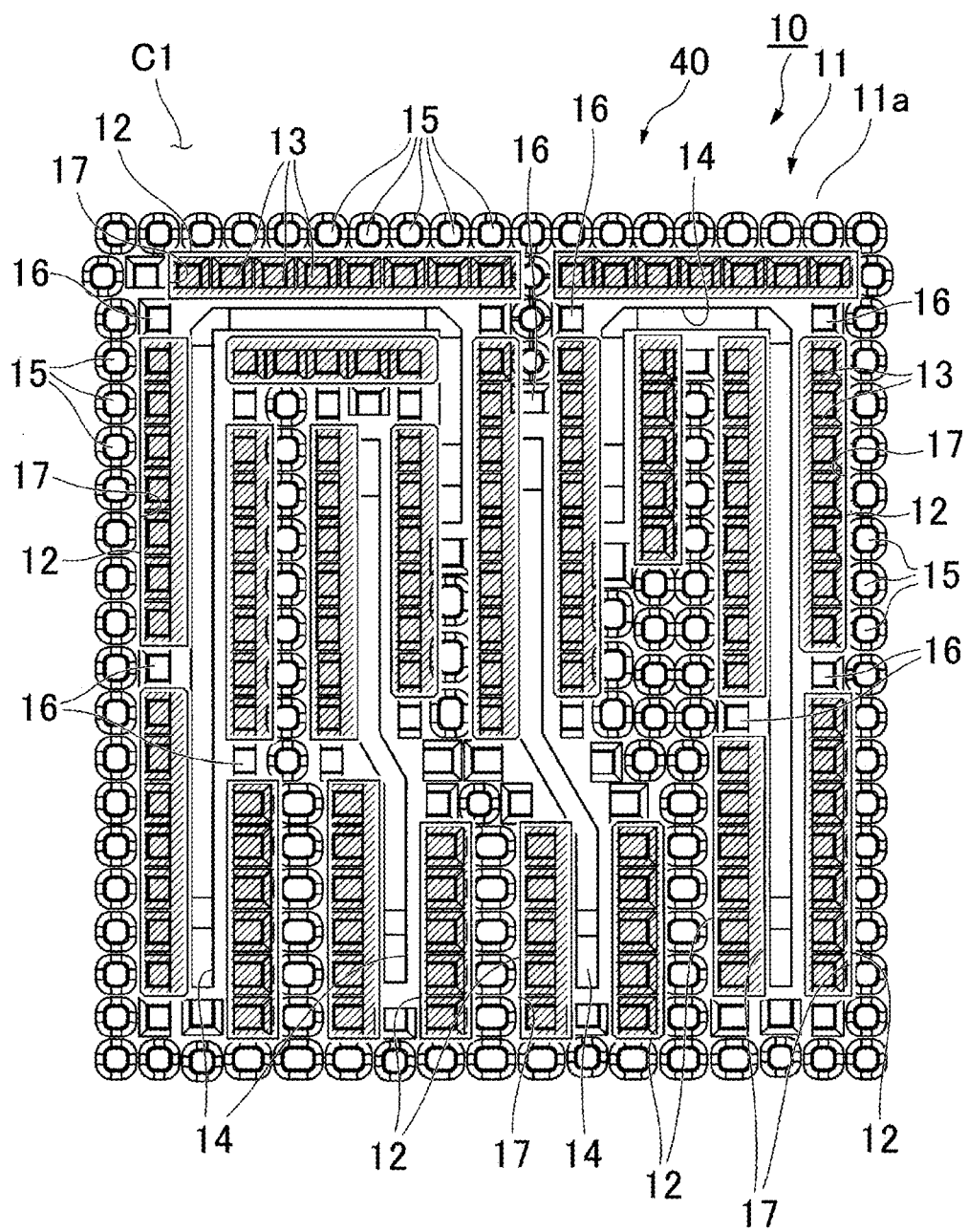
FIG. 7 is a partially enlarged plan view of a functional-region section 40 of the first die 10.

FIG. 7 is a plan view of the base 11 in a plan view state of the first surface 11a. In particular, one of functional-region sections 40 is enlarged and displayed. In the figure, plane arrangement of the accommodating recesses 17 and the inserts 12 fit in the accommodating recesses 17 is shown. In FIG. 7, hatching is added to the inserts 12 to highlight the inserts 12.

As shown in FIG. 7, the accommodating recesses 17 are preferably disposed right below rows in which the through-holes 13 are arranged. The rows of the through-holes 13 are adjacent to the stripe-shaped recesses 14. The accommodating recesses 17 extend along a direction in which the rows of the through-holes 13 arranged immediately above the accommodating recesses 17 extends.

The outer peripheral surfaces of the inserts 12 preferably have the same shape as the inner peripheral surfaces of the accommodating recesses 17 and have dimensions slightly smaller than the dimensions of the accommodating recesses 17. "Slightly" in this case indicates size enough to fit the inserts 12 in the accommodating recesses 17 or removing the fit inserts 12 without seriously damaging the inserts 12 or the accommodating recesses 17. The dimensions are different depending on various conditions such as the material of the die.

The inserts 12 are prepared at least as many as the accommodating recesses 17 and fit in the accommodating recesses 17. In this example, the inserts 12, which are independent individual members, are respectively housed in the accommodating recesses 17. However, the example embodiment of the present disclosure is not limited to such an arrangement. For example, an arrangement may be adopted in which a plurality of inserts 12 adjacent to one another are connected on the second surface 11b side to be formed a one member. Such inserts 12 assume, for example, an exterior similar to a column 46c (explained below) of a second kind shown in FIG. 12A.

As shown in FIG. 6, the through-holes 13 penetrate through the base 11 from the bottom surfaces 171 of the accommodating recesses 17 to the first surface 11a side of the base 11. The through-holes 13 have a (planar) rectangular shape when viewed from the normal direction of the first surface 11a. In portions where the through-holes 13 are opened on the accommodating recesses 17 side, the width of the openings is smaller than the width of the accommodating recesses 17. In other words, the openings in the through-holes 13 in the accommodating recesses 17 are covered by end surfaces on the first surface 11a side of the inserts 12. The entire peripheries of edges of the openings are in contact with the end surfaces on the first surface 11a side of the inserts 12. "In contact" is not limited to a state in which a gap is completely zero. In the present disclosure, even a state in which gaps in which burrs could occur remain between the bottom surfaces 171 of the accommodating recesses 17 and the end surfaces of the inserts 12 when a material is actually injected and molding work is performed is included in "in contact". The plane shape of the through-holes 13 is not limited to the rectangular shape. A circular shape, an elliptical shape, and the like can also be selected according to necessity. The plurality of through-holes 13 are arranged along the stripe-shaped recesses 14. The through-holes 13 are disposed adjacent to the stripe-shaped recesses 14. When viewed from the through-holes 13, the first recesses 15 are disposed on the opposite side of the stripe-shaped recesses 14. The plurality of first recesses 15 are disposed and arranged along the rows of the through-holes 13.

The inserts 12 are fit in the accommodating recesses 17. End surfaces 12a on the first surface 11a side of the inserts 12 close the openings on the accommodating recesses 17 side of the through-holes 13. The end surfaces 12a expand to the outer side of the edges of the openings on the second surface 11b side of the through-holes 13. The melted metal material is filled in the through-hole 13 and solidified, whereby the first kind of rods 53A (see FIG. 3) are molded.

In general manufacturing of a die, electric discharge machining is used in order to form fine recesses. However, when bottom surfaces and side surfaces of the recesses need to form clear corners, it is difficult to form the fine recesses with the electric discharge machining. This is because, in such corner portions, an unnecessary spark occurs in an electrode of the electric discharge machining.

According to this example embodiment, by covering the openings on the accommodating recesses 17 side of the through-holes 13 by the inserts 12, clear corners can be formed in the boundaries between the inner peripheral surfaces of the through-holes 13 and the end surfaces 12a of the inserts 12. In the radio-frequency member according to the present disclosure, the tip surfaces and the side surfaces of the first kind of rods 53A need to form clear corners. By configuring the base 11 of the first mold 10 in this way, clear corners can be formed at the tips of the first kind of rods 53A molded in the internal spaces of the through-holes 13.

In general, when a die is manufactured by the electric discharge machining, in molding of through-holes, sparking will less easily be generated compared with molding of recesses. Therefore, according to this example embodiment, when the first mold 10 is manufactured by the electric discharge machining, it is easy to improve die accuracy of the inner peripheral surfaces of the through-holes 13. Further, it is easy to polish the inner surfaces of the through-holes 13 compared with the recesses. Even when a spark occurs during the electric discharge machining, it is easy to remove a spark trace with polishing. That is, according to this example embodiment, in the first mold 10, it is easy to improve die accuracy of the through-holes 13 for molding the first kind of rods 53A. As a result, the dimension accuracy of the first kind of rods 53A can be improved.

In general, in die casting, gas easily accumulates on the insides of fine recessed shapes of a die. This hinders filling of a melted metal material. Therefore, it is difficult to form clear corners in projections of a molded article.

According to this example embodiment, gas can escape through an interstice between the inserts 12 and the bottom surfaces 171 of the accommodating recesses 17 during the molding. Therefore, the melted metal material is sufficiently filled in boundary portions between the inner peripheral surfaces of the through-holes 13 and the end surfaces 12a of the inserts 12 as well. Clear corners can be formed at the tips of the first kind of rods 53A. In the portions where the through-holes 13 are opened on the accommodating recesses 17 side, the width of the openings is smaller than the width of the accommodating recesses 17. Therefore, even if burrs occur on the inner peripheral surfaces of the through-holes 13 and the end surfaces of the inserts 12, the burrs are formed in a shape expanding in a direction to the outer side from the openings of the through-holes 13. For example, in FIG. 6, when a molded member is removed from the die, the member is moved in the upward direction in the figure. Therefore, the burrs hit the edges of the openings on the accommodating recesses 17 side of the through-holes 13 and are easily removed. In the structure in which the inserts are used, an effect of improving molding accuracy of the tip portions of the first kind of rods 53 can be expected in this regard as well.

The first kind of rods 53A provide a structure that ensures a performance of the artificial magnetic conductor in the first radio-frequency member 50. The second kind of rods 53B support the function of the first kind of rods 53A. By using the inserts 12, molding accuracy of, in particular, the tip portions of the first kind of rods 53A can be improved. On the other hand, molding accuracy as high as the molding accuracy of the first kind of rods 53A is not requested for the second kind of rods 53B.

In the die casting, sticking between the molded article and the die can sometimes occur on the inner peripheral surface of the die, especially, at the fine recesses thereof. When the sticking occurs, the die needs to be replaced. Therefore, the life of the die including the fine recesses is short in the past.

According to this example embodiment, the openings on the second surface 11b side of the through-holes 13 can be exposed by removing the inserts 12. Therefore, even when sticking occurs on the insides of the through-holes, it is easy to repair the die. As a result, the life of the first mold 10 can be extended.

As shown in FIG. 7, in a plan view, the plurality of through-holes 13 are adjacent to the stripe-shaped recess 14 and arranged along the direction in which the stripe-shaped recess 14 extend. As explained above, the stripe-shaped recess 14 molds the ridge 52 and the through-holes 13 mold the first kind of rods 53A. With the mold 2 in this example embodiment, it is possible to mold the first radio-frequency member 50 including the ridge 52 and the plurality of rods 53A adjacent to the ridge 52 and arranged along the direction in which the ridge 52 extends.

According to this example embodiment, the first mold 10 includes the plurality of inserts 12 and the base 11 includes the plurality of accommodating recesses 17 in which the inserts 12 are respectively fit. That is, all the openings of the plurality of through-holes 13 are preferably covered by the plurality of inserts 12, the length of each of which is smaller than the length of the stripe-shaped recess 14, rather than being covered by a single insert 12.

When the first mold 10 includes the inserts, since cutouts are provided by the accommodating recesses in the base 11 of the first mold 10, the rigidity of the base 11 is deteriorated. Therefore, when an insert structure is adopted over a wide range of one base 11, a bend easily occurs in the base 11 when a high pressure is applied to the metal material in a fluid state during the die casting. When the bend occurs, the gaps between the bottom surfaces 171 of the accommodating recesses 17 and the inserts 12 increase. Burrs easily occurs in the molded member.

According to this example embodiment, it is possible to secure the rigidity of the base 11 and prevent burrs from occurring at the corner portions of the tips of the first kind of rods 53A by preparing a plurality of relatively short accommodating recesses rather than preparing one long accommodating recess. In the radio-frequency member according to this example embodiment, the first kind of rods 53A are basically disposed in only the portions adjacent to the ridge 52. In the second kind of rods 53B not directly adjacent to the ridge 52, since molding accuracy as high as the molding accuracy of the first kind of rods 53A is not requested, a shape in which the tip surfaces and the side surfaces are connected by the curved surfaces is allowed. Therefore, the inserts 12 are not adopted in order to mold the second kind of rods 53B. In such parts, the first recesses 15 are used rather than the through-holes. That is, the through-holes 13 are arranged in rows and the rows are adjacent to the stripe-shaped recess 14. The plurality of first recesses 15 are arranged along the rows of the through-holes 13. That is, the rows of the through-holes 13 are located between the plurality of first recesses and the stripe-shaped recess 14. The number of the through-holes 13 forming the rows is three or more.

Even the rods adjacent to the ridges 52 are preferably partially molded using the recesses. Accordingly, the accommodating recesses are absent right below portions of the rods. Such recesses are shown as the second recesses 16 in FIGS. 6 and 7. Therefore, the accommodating recesses 17 are divided below the second recesses 16 and are reduced in length. It is possible to improve the rigidity of the base 11 by dividing the accommodating recesses 17 and reducing the length of the accommodating recesses in this way. The machining of the second recesses 16 is difficult because of the reason explained above. However, since the number of the second recesses 16 is small, a cost increase of the die machining is relatively small.

A minimum length of the accommodating recesses 17 with which the effect of improving the rigidity of the base 11 can be obtained by dividing the accommodating recesses 17 and reducing the length of the accommodating recesses 17 is equivalent to the length of two though-holes. As a more detailed structure, at least three through-holes 13 are arranged in rows, two through-holes 13 among the three through-holes 13 are opened in the bottom surface 171 of one accommodating recess 17 and the other one through-hole 13 is opened in the bottom surface 171 of another accommodating recess 17. The inserts 12 are respectively housed in the two accommodating recesses 17. In this case, the base 11 includes at least two accommodating recesses 17. When structure in which a rod is also formed in a boundary portion between two accommodating recesses 17 adjacent to each other is necessary, the second recess 16 is disposed. When viewed from a direction perpendicular to the first surface 11a, the center of the second recess 16 is located between the two accommodating recesses 17.

As shown in FIG. 6, three sides excluding one side adjacent to the stripe-shaped recess 14 in the opening on the first surface 11a side of the through-hole 13 have curved surfaces. That is, an edge of a part of the opening on the first surface 11a side of the through-hole 13 is rounded. By forming the curved surface in the opening on the first surface 11a side of the through-hole 13, inflow of the melted metal material into the through-hole 13 is facilitated. Consequently, it is possible to increase a filling degree of the metal material in the through-hole 13 and improve molding accuracy of the first kind of rods 53A.

One side adjacent to the stripe-shaped recess 14 in the opening on the first surface 11a side of the through-hole 13 does not involve a curved surface. That is, one side adjacent to the stripe-shaped recess 14 in the opening on the first surface 11a side of the through-hole 13 includes a corner. Consequently, the through-hole 13 can mold the first kind of rod 53A including a corner at the lower end of a side surface opposed to the ridge 52. It is easy to secure characteristics of the artificial magnetic conductor for a rod row by using the rod having such a shape as the rod disposed adjacent to the ridge.

The sectional area of the through-hole 13, taken perpendicularly to the axial direction of the through-hole 13, monotonically decreases from the opening on the first surface 11a side toward the second surface 11b side. That is, at least a part of the inner peripheral surface of the through-hole 13 has a taper shape narrowed from the second surface 11b side toward the opening on the first surface 11a side. As a result, the first kind of rod 53A molded by the through-hole 13 also has a taper shape.

A surface adjacent to the stripe-shaped recess 14 in the inner peripheral surface of the through-hole 13 is a plane orthogonal to the first surface 11a. Consequently, the through-hole 13 can mold the first kind of rod 53A including a side surface opposed to the side surface of the ridge 52 in parallel. It is easy to secure the characteristics of the artificial magnetic conductor for the rod row including the first kind of rod 53A.

The melted metal material is filled and solidifies, whereby the first recess 15 molds the second kind of rod 53B (see FIG. 3). The first recess 15 is provided on the bottom surface 31 of the main recess 30. That is, the first recess 15 is provided on the first surface 11a of the base 11. The first recess 15 recesses to the second surface 11b side from the first surface 11a. The first recess 15 has a rectangular shape rounded at four corners when viewed from a direction perpendicular to the first surface 11a.

In this example embodiment, an insert structure is preferably not adopted in the first recess 15 that molds the second kind of rod 53B. This is because the second kind of rod 53B does not require high molding accuracy compared with the first kind of rod 53A.

An edge of the opening of the first recess 15 preferably includes a convex curved surface shape. That is, the edge of the opening of the first recess 15 is rounded. Inflow of the melted metal material into the first recess 15 is facilitated by forming a curved surface in the opening of the first recess 15. Consequently, it is possible to improve a filling degree of the metal material in the first recess 15 and improve molding accuracy of the second kind of rod 53B.

The sectional area of the first recess 15, taken perpendicularly to the axial direction of the first recess 15, monotonically decreases from the opening toward the bottom of the first recess 15. That is, the inner peripheral surface of the first recess 15 has a taper shape narrowed from the opening toward the bottom.

The functional-region section 40 is explained with reference to FIG. 5 again.

The inner peripheral surface of the first cavity C1 preferably includes the bottom surface 31, a top surface 32 opposed to the bottom surface 31, a peripheral wall surface 33 that connects the bottom surface 31 and the top surface 32, and the functional-region section 40. The bottom surface 31 molds the upper surface 50a of the first radio-frequency member 50. The top surface 32 molds the lower surface 50b of the first radio-frequency member 50. The peripheral wall surface 33 molds the peripheral wall surface 50c of the first radio-frequency member 50.

The functional-region section 40 is provided in at least one of the bottom surface 31 and the top surface 32. The functional-region section 40 is a region where the functional region 50A of the first radio-frequency member 50 is formed.

FIG. 8 is a diagram showing, in particular, a dimensional relation among the sections of the functional-region section 40 in FIG. 6.

The functional-region section 40 includes any one or more kinds of the plurality of through-holes 13, the plurality of first recesses 15, and the plurality of second recesses 16. The functional-region section 40 may include one or more stripe-shaped recesses 14. In an example shown in FIG. 8, the functional-region section 40 include all of the forgoing.

The through-holes 13, the first recesses 15, and the second recesses 16 have different configuration one another but have a common object of molding of a rod. Accordingly, in the following explanation, the through-holes 13, the first recesses 15, and the second recesses 16 are sometimes collectively simply referred to as rod forming holes 43 without being distinguished. The stripe-shaped recesses 14 are sometimes referred to as ridge forming grooves 14 below in order to represent that molding of a ridge is a purpose.

The radio-frequency members 50 and 60 according to the present disclosure are characterized in that the radio-frequency members 50 and 60 include the artificial magnetic conductor configured by the plurality of conductive rods disposed in the functional region. The plurality of conductive rods needs to be disposed close to one another in order to function as the artificial magnetic conductor. In addition, the individual rods have to have height larger than width. Accordingly, a die used in molding such a radio-frequency member needs to satisfy certain conditions concerning dimensions and arrangements of rod forming holes. Detail of the conditions are explained below.

At least two rod forming holes 43 are disposed adjacent to each other in the functional-region section 40. The respective rod forming holes 43 have depth d13 larger than width w43. A distance h between edges of openings of two rod forming holes 13 adjacent to each other is smaller than the depth d13 of any one of the two rod forming holes 13. Therefore, the densely disposed plurality of rods 53 (see FIG. 3) can be defined by the plurality of rod forming holes 13. Not all of the adjacent two rod forming holes 13 need to satisfy such a relation. For a portion of the rod forming holes 13, a distance h between the opening of the rod forming holes 13 may be larger than the depth d of all the rod forming holes 13. However, in that case, a rod molded by such a rod forming hole 13 sometimes does not sufficiently play the function of the artificial magnetic conductor.

Holes other than the rod forming holes 13 may be disposed in the functional-region section 40. Such holes sometimes have, for example, width larger than depth.

The ridge forming grooves (the stripe-shaped recesses) 14 can also be disposed in the functional-region section. The length of the ridge forming grooves 14 is larger than width w14 in the bottom. Similarly, the length of the ridge forming grooves 14 is larger than depth d14.

A radio-frequency member according to an example embodiment of the present disclosure includes a functional region where a plurality of thin and long rods and a narrow and high ridge are densely disposed. Therefore, as explained above, a die used in molding the radio-frequency member preferably includes a region where thin holes and deep grooves are disposed close to one another. However, it is not easy to sufficiently fill melted metal in such thin holes and deep grooves. In particular, when a radio-frequency member for a submillimeter wave (frequency: about 20 GHz to about 30 GHz) or a millimeter wave is manufactured, since the widths of rods and ridges are also widths of approximately 1 mm or less, a filling failure easily occurs. In order to surely fill the melted metal, the various contrivances are introduced as explained above, in particular, concerning the rod forming holes 43. However, separately from this, it is desirable to introduce contrivances concerning the gate and the overflow. The term "overflow" is used as a term meaning a space in which an excess of melted metal material flowing out from the cavities flow in, or a term meaning an opening through which the excess of melted metal material flow into the space. The term "overflow" is also used as a term meaning the metal material solidified in the space. Similarly, the term "gate" is used as a term meaning an opening through which the melted metal material is injected into the cavity, or a term meaning the metal material solidified in a channel connected to the opening.

In order to sufficiently fill a material in a very small gap of the die, sufficient pressure needs to be applied to the melted metal material injected into the cavities. For that purpose, it is desirable to reduce resistance at the time when the melted metal material passes through the gate. On the other hand, when the melted metal material passes through the overflow, it is desirable that the resistance is slightly larger. In order to implement such conditions, it is necessary to design a die in which an aspect ratio of a gate opening is small and an opening of an overflow is small.

However, according to the research conducted by the inventors of example embodiments of the present disclosure, even if it is attempted to produce the radio-frequency members according to example embodiments of the present disclosure with the die designed in this way, it is difficult to sufficiently reduce, in particular, a filling failure in the functional-region section.

As a result of the research for solving the problem, the inventors of example embodiments of the present disclosure discovered that the filling failure can be sufficiently reduced by providing a gate having extremely large width and an overflow having extremely large width disposed to be opposed to the gate. This indicates that it is effective for improvement of a filling degree to increase a flow rate of the melted metal material rather than increasing pressure.

Details of the gate and the overflow are explained below.

Figure 9A:
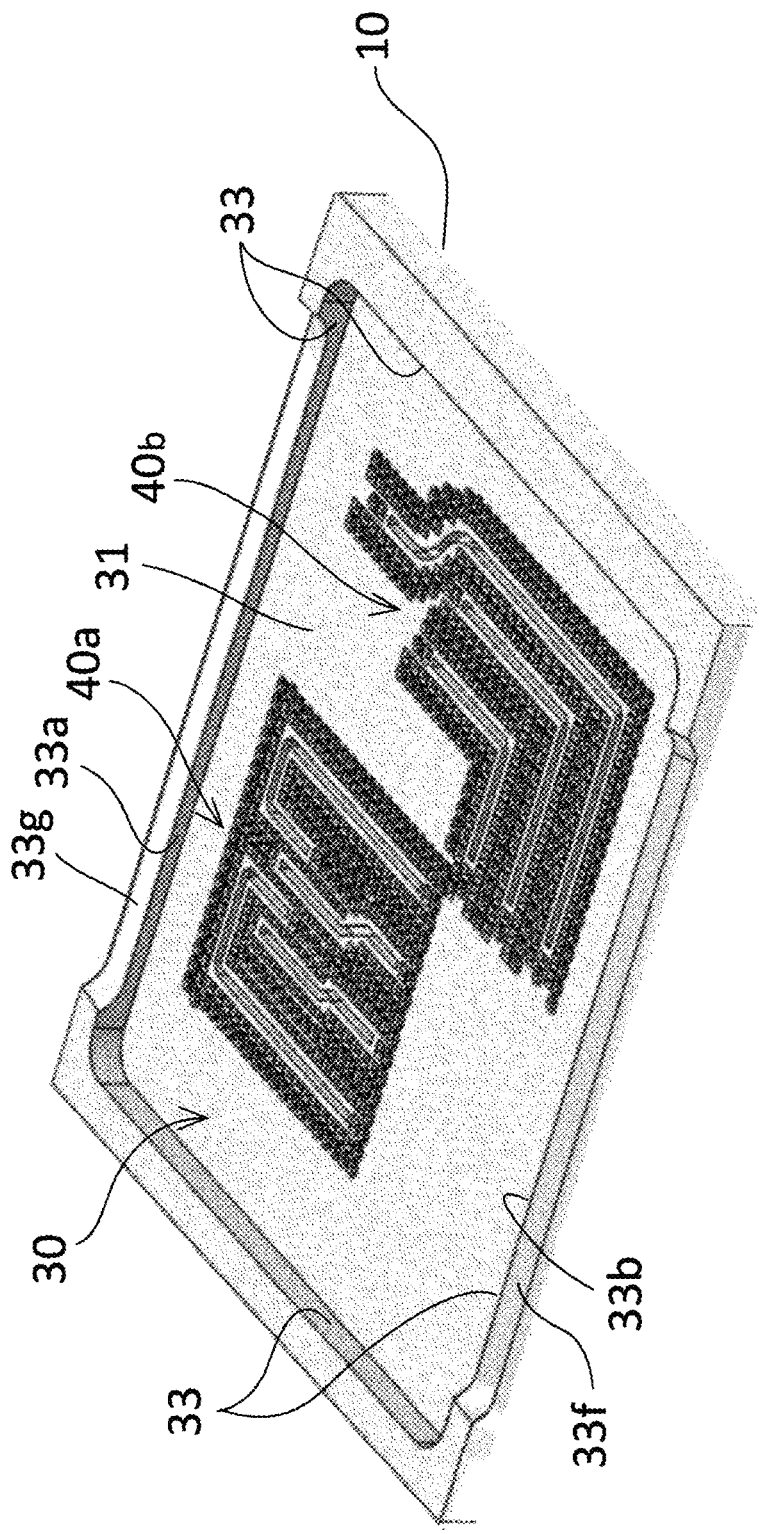
FIG. 9A is a partial perspective view of the first die 10 including first and second functional-region sections 40a and 40b.

FIG. 9A is a partial perspective view of the first mold 10 including a first functional-region section 40a and a second functional-region section 40b. The first mold 10 includes the main recess 30 opened upward in FIG. 9A. The first functional-region section 40a and the second functional-region section 40b are disposed on the bottom surface 31 of the main recess 30. The bottom surface 31 is surrounded by the peripheral wall surface 33. More specifically, the peripheral wall surface 33 indicates a wall surface extending in a direction away from the bottom surface 31. In this example, the peripheral wall surface 33 includes four wall surfaces. In a plan view of the bottom surface 31, the peripheral wall surface 33 has a rectangular shape long in one direction in FIG. 9A. Cutouts 33g and 33f are present in portions 33a and 33b of the peripheral wall surface 33 corresponding to the long sides of the rectangle. When the first mold 10 is combined with the second mold 20, the cutouts respectively form the opening of the gate 33g and the opening of the overflow 33f. In this description, for convenience, the same reference signs (33g and 33f) are attached to the two cutouts and the gate and the overflow formed by the cutouts.

Figure 9B:
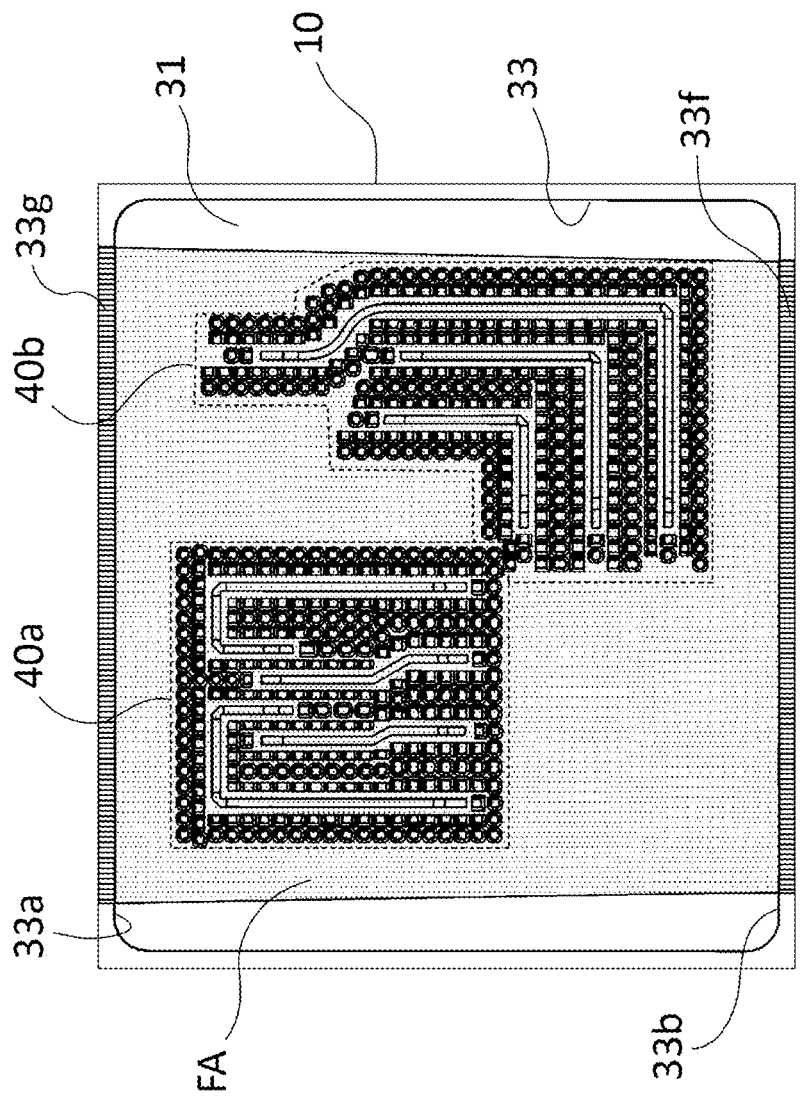
FIG. 9B is a plan view of the first die 10 and is a diagram in which the first and second functional-region sections 40a and 40b are respectively surrounded by dotted lines.

FIG. 9B is a plan view of the first mold 10. The first functional-region section 40a and the second functional-region section 40b are respectively surrounded by dotted lines. A main flow region FA is hatched. In the plan view, the first functional-region section 40a and the second functional-region section 40b are located on the bottom surface 31 and disposed on the inner side of the main flow region FA. When the first mold 10 is viewed along the normal direction of the bottom surface 31, the main flow region FA is defined to be a region swept by the gate 33g when the gate 33g of the first wall surface 33a is imaginarily linearly moved toward the overflow 33f of the second wall surface 33b. When the width of the gate 33g and the width of the overflow 33f are different, the width of the gate 33g under imaginary movement is reduced at a fixed rate during the movement. When reaching the overflow 33f, the gate 33g preferably has the same width as the width of the overflow 33f. In this description, it is assumed that "the region swept by the imaginarily moved gate" has the meaning explained above.

The main flow region defined as explained above can be expressed by another word. In FIG. 9B, a portion of the overflow 33f closest from the left end of the gate 33g is the left end of the overflow 33f. Similarly, a part of the overflow 33f closest from the right end of the gate 33g is the right end of the overflow 33f. A quadrilateral region is drawn by respectively connecting end portions of the gate 33g and portions of the overflow 33f closest from the end portions. The quadrilateral region can also be defined as the main flow region FA.

An example embodiment in which functional-region sections are respectively disposed on the top surface and the bottom surface of the cavity inner peripheral surface is also included in the disclosure of this application. In that case, in a strict sense, main flow regions can also be respectively defined for the top surface and the bottom surface. However, when the top surface and the bottom surface are parallel or substantially parallel, a defined main flow region is the same irrespective of which of the top surface and the bottom surface is viewed in a plan view. Accordingly, in this case, when the main flow region is defined, no difference occurs irrespective of which of the top surface and the bottom surface is set as a reference.

The main flow region defined as explained above corresponds to a region inside the cavity where, in the melted metal flowing into the inside of the cavity from the gate, a portion linearly flowing toward the overflow passes. By disposing the functional-region section on the inner side of the main flow region, it is possible to secure a sufficient amount of the melted metal passing through the functional-region section. It is possible to increase a filling degree of the melted metal in the recesses and the grooves.

In this example, when viewed from a direction perpendicular to the top surface, the cavity is a rectangle chamfered at four corners and the gate 33g and the overflow 33f are disposed on longer sides 33a and 33b of a peripheral wall surface surrounding the cavity. By disposing the gate 33g and the overflow 33f in this way, not only the width of the gate 33g and the width of the overflow 33f can be increased but also the distance between the gate 33g and the overflow 33f can be reduced. The reduction of the distance between the gate 33g and the overflow 33f also contributes to the increase of the filling degree of the melted metal into the recesses and the grooves in the first functional-region section 40a and the second functional-region section 40b.

An area of an opening of the overflow 33f is desirably about 85% or more and about 100% or less with respect to an area of an opening of the gate 33g. By configuring the gate 33g and the overflow 33f in this way, the pressure of the melted metal material rises when the melted metal material is injected into the first cavity C1. The filling degree of the metal material in the first and second functional-region sections 40a and 40b can be increased.

Figure 9C:
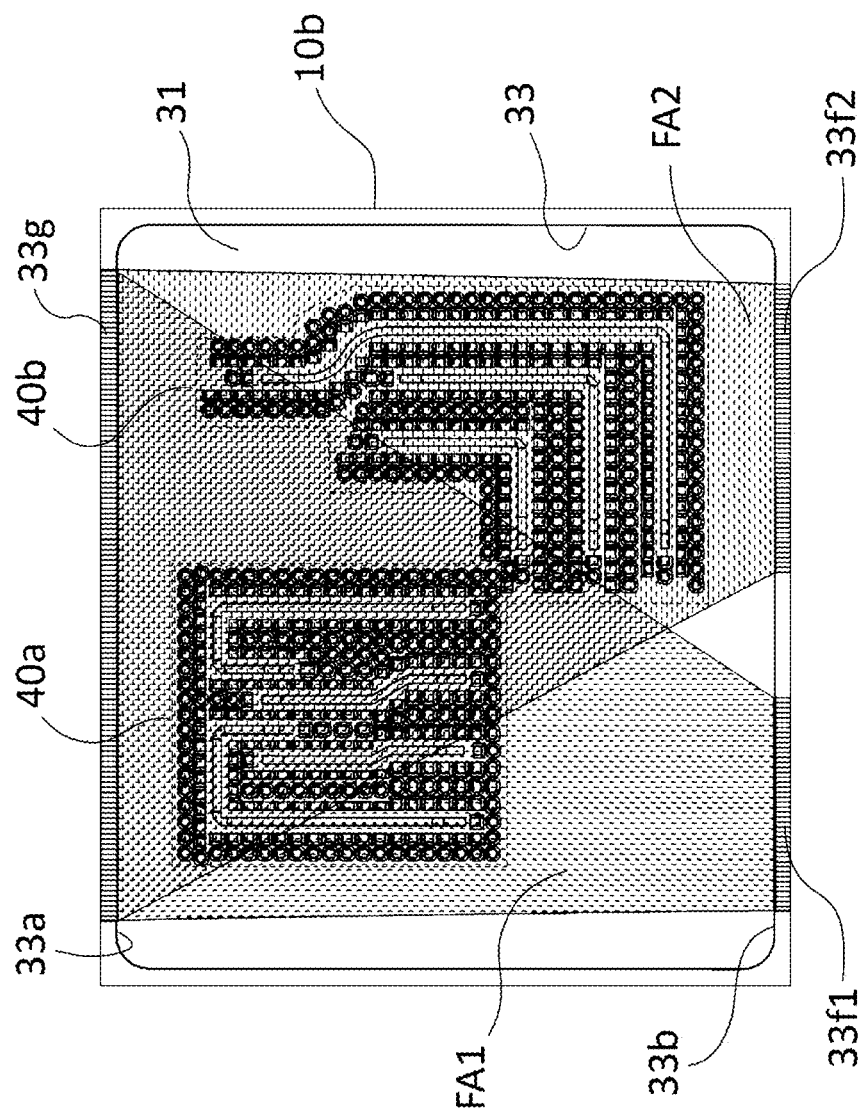
FIG. 9C is a plan view showing a first die 10b in a modification of an example embodiment of the present disclosure.

FIG. 9C is a plan view showing a first mold 10b in a modification of this example embodiment. A shape of the peripheral wall surface 33 and a shape and an arrangement of the first functional-region section 40 are the same as those of the first mold 10. A feature of the arrangement that the gate 33g is disposed on the first wall surface, which is the longer side of the peripheral wall surface surrounding the cavity, is also the same. An overflow is the same as the overflow in the first mold 10 in that the overflow is disposed on the second wall surface 33b, which is the longer side of the peripheral wall surface, but is different in that the overflow is divided into two overflows 33f1 and 33f2. In this case, a first main flow region FA1 and a second main flow region FA2 are defined. The first functional-region section 40a is located on the inner side of the first main flow region FA1. The second functional-region section 40b is located on the inner side of the second main flow region FA2.

In this example, the first main flow region FA1 is a region swept by the gate 33g when the gate 33g on the first wall surface 33a is imaginarily linearly moved toward the first overflow 33f1 of the second wall surface 33b. The second main flow region FA2 is a region swept by the gate 33g when the gate 33g of the first wall surface 33a is imaginarily linearly moved toward the second overflow 33f2 of the second wall surface 33b. In both the cases, the size of the gate 33g and the size of the overflows 33f1 and 33f2 are different. As explained above, the width of the gate 33g in the imaginary sweeping in such a case is reduced at a fixed rate during the movement and, when the gate 33g reaches the overflow 33f1 or 33f2, the gate 33g has the same width as the width of each of the overflows 33f1 and 33f2.

As in the example shown in FIG. 9B, in the example shown in FIG. 9C, the main flow region can be defined by another expression. In FIG. 9C, a part of the overflow 33f1 closest from the left end of the gate 33g is the left end of the overflow 33f1. Similarly, a part of the overflow 33f1 closest from the right end of the gate 33g is the right end of the overflow 33f1. A quadrilateral region is drawn by respectively connecting end portions of the gate 33g and parts of the overflow 33f1 closest from the end portions. This quadrilateral region can also be defined as the main flow region FA1. The same quadrilateral can be drawn by the gate 33g and the overflow 33f2. The quadrilateral region can also be defined as the main flow FA2.

By dividing the overflow into two, it is possible to adjust a flow of the melted metal inside the cavity and increase a filling degree in the recesses and the grooves in the functional-region section. In this example, the overflow is divided. However, the gate may be divided in another example of the present disclosure. Both of the gate and the overflow can also be divided. For example, the gate may be divided into two and, at the same time, the overflow may be divided into two. In this case, four main flow regions are defined. In the example shown in FIG. 9C, such a plurality of main flow regions FA1 and FA2 partially overlap. Even if such an overlapping region is formed, if the functional-region section is within a range of a combined region of FA1 and FA2, the filling degree of the melted metal in the recesses and the grooves can be increased. Note that the "combined region of FA1 and FA2" means a region obtained by combining FA1 and FA2, and any point in the combined region is covered by at least one of FA1 and FA2. The combined region can be defined for three or more main flow regions by combining them.

When the overflow is divided, a total of opening areas of the overflows 33f1 and 33f2 is desirably about 85% or more and about 100% or less with respect to the opening area of the gate 33g. By configuring the gate 33g and the overflows 33f1 and 33f2 in this way, the pressure of the melted metal material rises when the melted metal material is injected into the first cavity C1. The filling degree of the metal material in the first functional-region section 40a and the second functional-region section 40b can be increased.

When both of a plurality of overflows 33f and a plurality of gates 33g are disposed on the inner peripheral surface of the first cavity C1, a sum of opening areas of the plurality of overflows 33f is desirably about 85% or more and about 100% or less with respect to a sum of opening areas of the plurality of gates 33g.

FIG. 10A is a plan view of a first mold 10c in another modification of this example embodiment. Columns 44a of a first kind and columns 46a and 46c of a second kind are also shown. The columns 44a of the first kind and the columns 46a and 46c of the second kind are manufactured as separate members from a main body portion of the first mold 10c or a second mold 20b. One ends of the columns 44a of the first kind and the columns 46a and 46c of the second kind are housed in holes (not shown in FIG. 10A) provided in the main body portions. The columns 44a of the first kind and the columns 46a and 46c of the second kind function as parts of the first mold 10c or the second mold 20b. The width of the columns 44a of the first kind is relatively large and exceeds a quadruple of the width of the rod forming holes 43. The columns 46a and 46c of the second kind at least partially include narrow portions. The width in the narrow portions is a triple or less of the width of the rod forming holes 43. The first mold 10c includes a first functional-region section 41a and a second functional-region section 41b. In the first mold 10c, as in the first mold 10 and the first mold 10b, the gate 33g is disposed on the first wall surface 33a, which is the longer side of the peripheral wall surface. As in the first mold 10b, the overflow is divided into two overflows 33f3 and 33f4 which open on the second wall surface 33b. In this case, the first main flow region FA1 and the second main flow region FA2 are defined. The first functional-region section 41a is located on the inner side of the first main flow region FA1. The second functional-region section 41b is located on the inner side of the second main flow region FA2.

In this modification, the columns 44a of the first kind involves annular recesses 44c that are provided around the columns 44a of the first kind. During the molding, the melted metal is filled in the annular recesses 44c and annular columns are formed. The annular columns are the fixing sections 68 in the second radio-frequency member 60. The column 46a of the second kind is located on the inner side of the second functional-region section 41b. The column 46c of the second kind is located on the inner side of the first functional-region section 41a. The first functional-region section 41a is located on the inner side of the first main flow region FA1. The second functional-region section 41b is located on the inner side of the second main flow region FA2. Since the first mold 10c has such arrangement, the melted metal sufficiently flows around the columns 46a and 46c of the second kind during the molding. Therefore, the melted metal is sufficiently filled in the ridge forming grooves 14 and the rod forming holes 43 adjacent to the columns 46a and 46c of the second kind.

A plurality of the columns 44a of the first kind are disposed in the first mold 10c. At least a portion of the columns 44a of the first kind are partially located on the outer side of the first or second main flow regions FA1 or FA2. Alternatively, the columns 44a of the first kind entirely located on the outer side of the main flow regions FA1 and FA2 may be present. Since the columns 44a of the first kind have large widths compared with the column 46a or 46c of the second kind, if the columns 44a of the first kind are disposed in the main flow regions FA1 and FA2, it is likely that disturbance occurs in the flow of the melted metal material on the downstream side of the columns 44a of the first kind and voids occur on the inside of the molded article. According to this example embodiment, by disposing at least a portion of the columns 44a of the first kind on the outer side of the main flow regions FA1 and FA2, it is possible to prevent the voids due to the columns 44a of the first kind from occurring in the functional regions. When a plurality of columns of the first kind are present, it is not always easy to dispose all of the columns of the first kind outside the main flow regions.

Figure 10B:
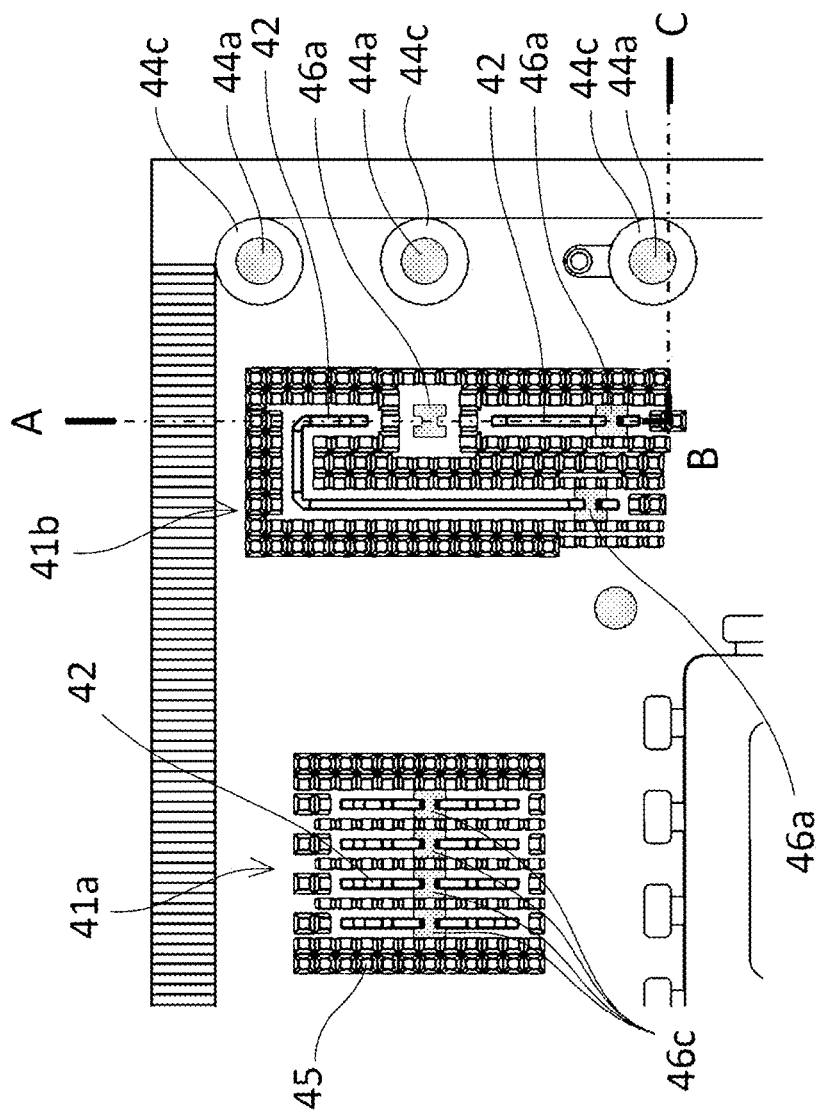
FIG. 10B is an enlarged view of the vicinities of the first and second functional-region sections 41a and 41b in the first die 10c.

FIG. 10B is an enlarged view of the vicinities of the first and second functional-region sections 41a and 41b in the first mold 10c. Three columns 46a of the second kind are disposed on the inner side of the second functional-region section 41b. Intervals among the columns 46a of the second kind are equal to or larger than the widths of the respective columns 46a of the second kind. Four columns 46c of the second kind are disposed on the inner side of the first functional-region section 41a. Intervals among the columns 46c of the second kind are smaller than the widths of the respective columns 46c of the second kind. In all of these cases, by disposing the columns 46a and 46c of the second kind on the inner side of one of the main flow regions, it is possible to sufficiently fill the melted metal around the columns 46a and 46c of the second kind.

Figure 11:
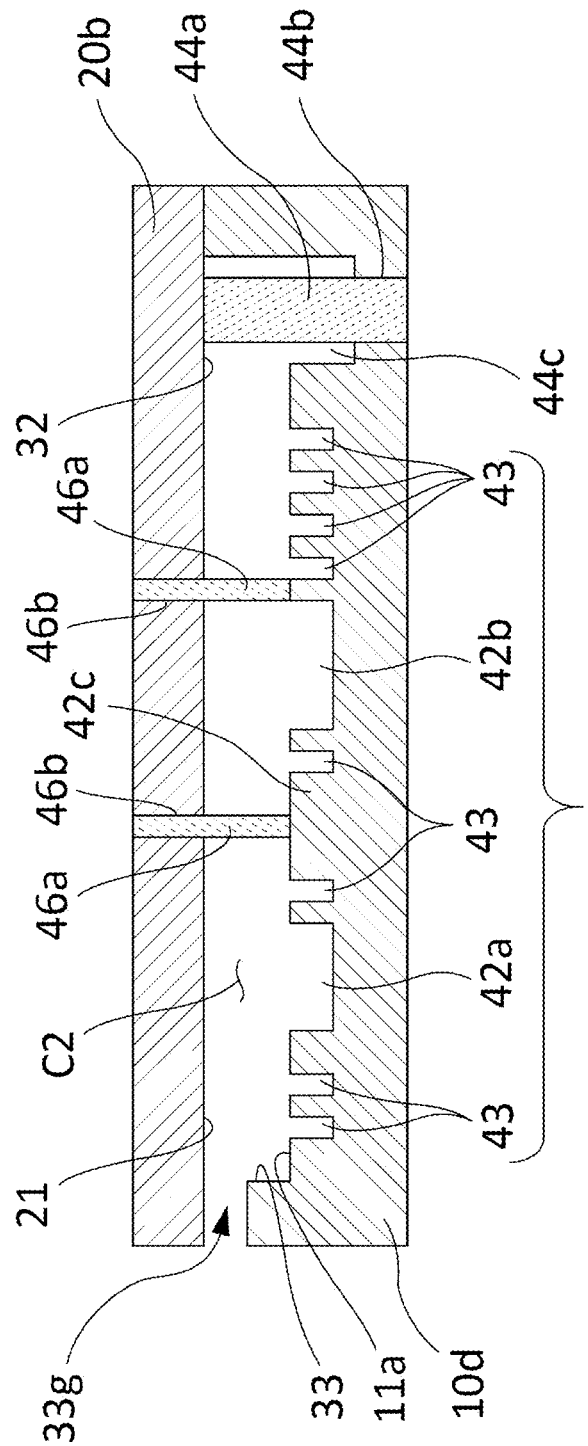
FIG. 11 is a schematic sectional view of a first die 10d and a second die 20b taken along a line A-B-C in FIG. 10B.

FIG. 11 is a schematic sectional view of the first mold 10c and the second mold 20b taken along a line A-B-C in FIG. 10B. The first mold 10c and the second mold 20b are combined and closed. The second cavity C2 is formed. The second radio-frequency member 60 is molded using the second cavity C2.

The second cavity C2 preferably includes a portion having a configuration similar to the configuration of the first cavity C1. Therefore, in explanation of the second cavity C2, the same components as the components of the first cavity C1 are denoted by the same reference numerals and explanation of the components is omitted.

A first mold 10d preferably includes a first surface 11a opposed to the second mold 20b. The second mold 20b includes a second surface 21 opposed to the first mold 10d. The main recess 30 opened toward the second surface 21 is disposed on the first surface 11a. The bottom surface 31 of the main recess 30 is surrounded by the peripheral wall surface 33. The peripheral wall surface 33 is a surface extending from the bottom surface 31 toward the second surface 21. A portion of the second surface 21 corresponding to the inner peripheral surface of the second cavity C2 is referred to as top surface 32.

In FIG. 11, the second functional-region section 41b and the annular recess 44c are disposed on the bottom surface 31. A column housing hole 44b of the first kind is opened in the bottom surface 31. A base of the column 44a of the first kind is housed in the column housing hole 44b of the first kind. A tip surface of the column 44a of the first kind is in contact with the top surface 32. Like the first functional-region section 41a, the second functional-region section 41b includes a plurality of rod forming holes 43 and the ridge forming groove 42. In FIG. 11, the ridge forming groove 42 extends along the cross section and includes two portions 42a and 42b extending in the right-left direction. A rise 42c and the rod forming holes 43 are disposed between the two parts 42a and 42b of the ridge forming groove 42. The second functional-region section 41b includes the columns 46a of the second kind. A column housing hole 46b of the second kind is opened in the top surface 32. An upper part of the column 46a of the second kind is housed in the column housing hole 46b of the second kind. The lower end surface of the column 46a of the second kind is in contact with the top surface of the rise 42c.

When the melted metal is filled in the second cavity C2 and solidifies, the column 44a of the first kind molds a hole penetrating through the second radio-frequency member 60. The column 46a of the second kind molds a hole penetrating through the second radio-frequency member 60. The hole is connected to a portion where a ridge defined by the rise 42c is absent.

In FIG. 11, a cross section of the first mold 10d, the column 44a of the first kind, or the column 46a of the second kind on a surface parallel to the top surface 32 is hereinafter referred to as horizontal cross section. In the horizontal cross section of the first mold 10d, the horizontal cross section of the annular recess 44c has a circular external shape and the sectional shape of the column 44a of the first kind and the column housing hole 44b of the first kind are also respectively circles. The horizontal cross section of the column 46a of the second kind is an H shape. The horizontal cross section of the column 46a of the second kind is not limited to the H shape. A shape such as an I shape or a U shape can be selected. The column 46a of the second kind and the column housing hole 46b of the second kind have the same horizontal sectional shape.

The annular recess 44c, the column 44a of the first kind, and the column housing hole 44b of the first kind are disposed on the outer side of the second functional-region section 41b. That is, the annular recess 44c, the column 44a of the first kind, and the column housing hole 44b of the first kind are not accompanied by the plurality of rod forming holes 43 adjacent to these parts and members and disposed across these parts and members. On the other hand, as shown in FIG. 10B, in a plan view along a direction perpendicular to the top surface 32, the column 46a of the second kind is accompanied by the plurality of rod forming holes 43 adjacent to the column 46a of the second kind and disposed across the column 46a of the second kind. Here, "adjacent" means a positional relation in which, in a plan view state, the rod forming holes 43 are apart from the column 46a of the second kind only a distance smaller than a double of the depth of the rod forming holes 43.

A hole molded by the column 44a of the first kind can be used to house a fixing member such as a screw that fixes the second radio-frequency member 60 to another member. A hole molded by the column 46a of the second kind can be used as a waveguide that allows an electromagnetic wave to propagate.

The terms "bottom surface" and "top surface" used in this description do not mean that the bottom surface is actually located on the ground side and that the top surface is actually located on the ceiling side. One of a pair of opposed surfaces is only called bottom surface and the other is only called top surface. During actual manufacturing, the top surface could be located on the ground side or the top surface could face the horizontal direction.

Figure 12B:
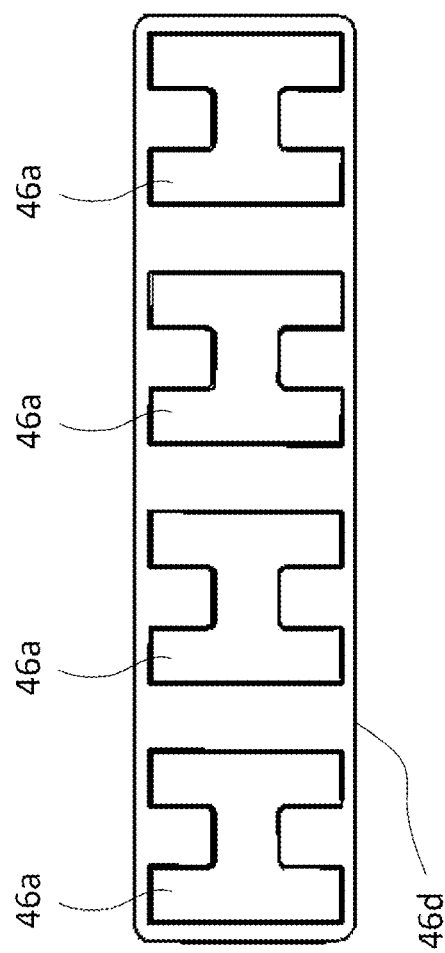
FIG. 12B is a bottom view of the column 46c of the second kind.

FIGS. 12A and 12B are diagrams that illustrate the column 46c of the second kind. FIG. 12A is a perspective view of a member including four columns 46c of the second kind. The four columns 46c of the second kind are connected to one wide column 46d on the side of the base. Only the portion of the column 46c of the second kind is located on the inside of the cavity C2. In this example, although the four columns 46c of the second kind are disposed close to one another, since the four columns 46c of the second kind are jointed to be one in the base, it is easy to handle the four columns 46c of the second kind.

FIG. 12B is a view of the columns 46c of the second kind viewed from the lower side in FIG. 12A. The respective columns 46c of the second kind has a sectional shape of an H shape. The four columns 46c of the second kind are arranged along a direction in which a horizontal portion of the H shape extends. A gap between the columns 46c of the second kind adjacent to each other is smaller than the width of the columns 46c of the second kind.

The cross section of the column 44a of the first kind has a simple shape such as a circle or a square. However, the columns 46a and 46c of the second kind can take a more complicated shape such as an H shape or a U shape. In the example shown in FIGS. 12A and 12B in which the columns having such a complicated shape are arranged close to one another, it is possible to suppress occurrence of a filling failure during the molding by disposing the columns in the main flow region.

While example embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

What is claimed is:

1. A manufacturing method of a radio-frequency member, comprising:
   preparing a plurality of dies including at least a first die and a second die;
   combining the first die and the second die to form an internal cavity;
   injecting a metal material in a fluid state into the cavity; and
   separating the first die and the second die after the metal material solidifies, and taking out a radio-frequency member or an intermediate product of the radio-frequency member; wherein
   an inner peripheral surface of the cavity includes a top surface, a bottom surface opposed to the top surface, a peripheral wall surface connecting the top surface and the bottom surface and surrounding a space between the top surface and the bottom surface, and a functional-region section provided on at least one surface of the top surface and the bottom surface to define a portion of the radio-frequency member;
   the peripheral wall surface includes a first wall surface and a second wall surface located on opposite sides of the space from each other;
   a gate extending in a direction in which the first wall surface extends is open on the first wall surface;
   an overflow extending in a direction in which the second wall surface extends is open on the second wall surface;
   the functional-region section is located inside a main flow region;
   the main flow region is a region swept by the gate when the gate is imaginarily linearly moved toward the second wall surface when viewed from a normal direction of the at least one surface;
   the functional-region section includes a plurality of holes;
   at least two holes adjacent to each other among the plurality of holes are rod forming holes each having a depth larger than width;

a distance between edges of openings of the at least two rod forming holes is smaller than the depths of both of the two rod forming holes; and the metal material in the fluid state is injected into the cavity through the gate and a portion of the metal material flows to an outside of the cavity from the overflow.

2. The manufacturing method of the radio-frequency member of claim 1, wherein
a cross section of the at least one of the at least two rod forming holes, taken perpendicularly to an axial direction thereof, monotonically decreases the opening toward a bottom; and
the edge of the opening of the at least one of the at least two rod forming holes has a convex curved shape.

3. The manufacturing method of the radio-frequency member of claim 1, wherein
in the cavity, one or a plurality of a first kind of columns are disposed, the first kind of columns have a columnar shape, reach the top surface from the bottom surface, and have an outer diameter larger than width of the rod forming holes when viewed from the normal direction; and
at least one of the first kind of columns is partially located on an outer side of the main flow region, or at least one of the first kind of columns is located entirely on the outer side of the main flow region.

4. The manufacturing method of the radio-frequency member according to claim 1, wherein
a cross section of the at least one of the at least two rod forming holes, taken perpendicularly to an axial direction thereof, monotonically decreases the opening toward a bottom;
the edge of the opening of the at least one of the at least two rod forming holes has a convex curved shape;
in the cavity, one or a plurality of a first kind of columns are disposed, the first kind of columns have a columnar shape, reach the top surface from the bottom surface, and have an outer diameter larger than width of the rod forming holes when viewed from the normal direction; and
at least one of the first kind of columns is partially located on an outer side of the main flow region, or at least one of the first kind of columns is located entirely on the outer side of the main flow region.

5. The manufacturing method of the radio-frequency member according to claim 4, wherein
in the cavity, a second kind column, having a columnar shape, located on an inner side of the main flow region and reaching the top surface from the bottom surface is disposed;
a plurality of the first kind of columns are disposed in the cavity; and
when viewed from the normal direction, a sectional area of the second kind column is smaller than a sectional area of at least two of the plurality of the first kind of columns.

6. The manufacturing method of the radio-frequency member of claim 1, wherein
in the cavity, one or a plurality of a first kind of columns, having a columnar shape, reaching the top surface from the bottom surface and having an outer diameter larger than width of the rod forming holes when viewed from the normal direction are disposed;
at least one of the first kind of columns is partially located on an outer side of the main flow region, or at least one of the first kind of columns is located entirely on the outer side of the main flow region;
in the cavity, a second kind column, having a columnar shape, located on an inner side of the main flow region and reaching the top surface from the bottom surface is disposed;
a plurality of the first kind of columns are disposed in the cavity; and
when viewed from the normal direction, a sectional area of the second kind column is smaller than a sectional area of at least two of the plurality of the first kind of columns.

7. The manufacturing method of the radio-frequency member of claim 1, wherein an opening area of the overflow is about 85% or more and about 100% or less of an opening area of the gate.

8. The manufacturing method of the radio-frequency member of claim 1, wherein
in the cavity, one or a plurality of a first kind of columns are disposed, the first kind of columns has a columnar shape, reaches the top surface from the bottom surface, and has an outer diameter larger than width of the rod forming holes when viewed from the normal direction;
at least one of the first kind of columns is partially located on an outer side of the main flow region, or at least one of the first kind of columns is located entirely on the outer side of the main flow region;
an opening area of the overflow is about 85% or more and about 100% or less of an opening area of the gate;
in the cavity, a second kind of columns is disposed, the second kind of columns has a columnar shape, is located on an inner side of the main flow region, and reaches the top surface from the bottom surface;
a plurality of the first kind of columns is disposed in the cavity; and
when viewed from the normal direction, a sectional area of the second kind of columns is smaller than a sectional area of at least two of the plurality of the first kind of columns.

9. The manufacturing method of the radio-frequency member of claim 1, wherein
the functional-region section includes a ridge forming groove having length larger than depth thereof and width at the bottom thereof; and
at least two of the rod forming holes are adjacent to the ridge forming groove.

10. A waveguide device comprising:
a plurality of radio-frequency members respectively manufactured by the manufacturing method of the radio-frequency member of claim 1;
a circuit board disposed on one or more of the plurality of radio-frequency members; wherein
the functional-region section includes a ridge forming groove having length larger than depth thereof and width at the bottom thereof;
at least two of the rod forming holes are adjacent to the ridge forming groove;
one of the plurality of radio-frequency members includes a first conductive surface and a second conductive surface opposing an opposite direction of the first conductive surface;
another one of the plurality of radio-frequency members include a third conductive surface and a fourth conductive surface opposing an opposite direction of the third conductive surface;

in the cavity, the first conductive surface contacts the top surface and the second conductive surface contacts the bottom surface;

in the cavity, the third conductive surface contacts the top surface and the fourth conductive surface contacts the bottom surface; and one of the first conductive surface and the second conductive surface is opposed to one of the third conductive surface and the fourth conductive surface.

11. A waveguide device comprising:

a plurality of radio-frequency members respectively manufactured by the manufacturing method of the radio-frequency member of claim 1;

a circuit board disposed on one or more of the plurality of radio-frequency members; wherein the functional-region section includes a ridge forming groove having length larger than depth thereof and width at the bottom thereof;

at least two of the rod forming holes are adjacent to the ridge forming groove;

in the cavity, one or a plurality of a first kind of columns, having a columnar shape, reaching the top surface from the bottom surface and having an outer diameter larger than width of the rod forming holes when viewed from the normal direction are disposed;

at least one of the first kind of columns is partially located on an outer side of the main flow region, or at least one of the first kind of columns is located entirely on the outer side of the main flow region;

one of the plurality of radio-frequency members includes a first conductive surface and a second conductive surface opposing an opposite direction of the first conductive surface;

another one of the plurality of radio-frequency members include a third conductive surface and a fourth conductive surface opposing an opposite direction of the third conductive surface;

in the cavity, the first conductive surface contacts the top surface and the second conductive surface contacts the bottom surface;

in the cavity, the third conductive surface contacts the top surface and the fourth conductive surface contacts the bottom surface; and one of the first conductive surface and the second conductive surface is opposed to one of the third conductive surface and the fourth conductive surface.

12. A manufacturing method of a radio-frequency member, comprising:

preparing a plurality of dies including at least a first die and a second die;

combining the first die and the second die to form an internal cavity;

injecting a metal material in a fluid state into the cavity; and separating the first die and the second die after the metal material solidifies and taking out a radio-frequency member or an intermediate product of the radio-frequency member; wherein an inner peripheral surface of the cavity includes a top surface, a bottom surface opposed to the top surface, a peripheral wall surface connecting the top surface and the bottom surface and surrounding a space between the top surface and the bottom surface, and a functional-region section provided on at least one surface of the top surface and the bottom surface to define the radio-frequency member;

the peripheral wall surface includes a first wall surface and a second wall surface located on opposite sides from each other when viewed from a normal direction of the top surface;

a gate extending in a direction in which the first wall surface extends is open on the first wall surface;

an overflow extending in a direction in which the second wall surface extends is open on the second wall surface;

the functional-region section is located inside a main flow region;

the main flow region is a quadrilateral region defined by respectively connecting both ends of the gate and both ends of the overflow when viewed from the normal direction;

the functional-region section includes a plurality of holes;

at least two holes adjacent to each other among the plurality of holes are rod forming holes each having depth larger than width;

a distance between edges of openings of the at least two rod forming holes is smaller than the depths of both of the two rod forming holes; and the metal material in the fluid state is injected into the cavity through the gate, and a portion of the metal material flows out to an outside of the cavity through the overflow.

13. The manufacturing method of the radio-frequency member of claim 12, wherein the second wall surface includes a plurality of the overflows;

in the cavity, a plurality of the quadrilateral main flow regions defined by respectively connecting both the ends of the gate and both ends of the plurality of overflows when viewed from the normal direction are formed; and an entire region of the functional-region section is covered by a region obtained by combining at least two main flow regions among the plurality of main flow regions.

14. The manufacturing method of the radio-frequency member of claim 12, wherein in the cavity, one or a plurality of a first kind of columns are disposed, the first kind of columns have a columnar shape, reach the top surface from the bottom surface, and have an outer diameter larger than width of the rod forming holes when viewed from the normal direction; and at least one of the first kind of columns is partially located on an outer side of the main flow region, or at least one of the first kind of columns is located entirely on the outer side of the main flow region.

15. The manufacturing method of the radio-frequency member of claim 12, wherein the second wall surface includes a plurality of the overflows;

in the cavity, a plurality of the quadrilateral main flow regions defined by respectively connecting both the ends of the gate and both ends of the plurality of overflows when viewed from the normal direction are formed;

an entire region of the functional-region section is covered by a region obtained by combining at least two main flow region among the plurality of main flow regions;

in the cavity, one or a plurality of a first kind of columns, having a columnar shape, reaching the top surface from the bottom surface and having an outer diameter larger than width of the rod forming holes when viewed from the normal direction are disposed; and at least one of the first kind of columns is partially located on an outer side of the main flow region, or at least one of the first kind of columns is located entirely on the outer side of the main flow region.

16. The manufacturing method of the radio-frequency member of claim 12, wherein in the cavity, one or a plurality of a first kind of columns, having a columnar shape, reaching the top surface from the bottom surface and having an outer diameter larger than width of the rod forming holes when viewed from the normal direction are disposed;

at least one of the first kind of columns is partially located on an outer side of the main flow region, or at least one of the first kind of columns is located entirely on the outer side of the main flow region;

in the cavity, a second kind of columns is disposed, the second kind of columns has a columnar shape, is located on an inner side of the main flow region, and reaches the top surface from the bottom surface;

a plurality of the first kind of columns is disposed in the cavity; and when viewed from the normal direction, a sectional area of the second kind of columns is smaller than a sectional area of at least two of the plurality of the first kind of columns.

17. The manufacturing method of the radio-frequency member of claim 12, wherein the second wall surface includes a plurality of the overflows;

in the cavity, a plurality of the quadrilateral main flow regions defined by respectively connecting both the ends of the gate and both ends of the plurality of overflows when viewed from the normal direction are formed;

an entire region of the functional-region section is covered by a region obtained by combining at least two main flow region among the plurality of main flow regions;

in the cavity, one or a plurality of a first kind of columns are disposed, the first kind of columns have a columnar shape, reach the top surface from the bottom surface, and have an outer diameter larger than width of the rod forming holes when viewed from the normal direction;

at least one of the first kind of columns is partially located on an outer side of the main flow region, or at least one of the first kind of columns is located entirely on the outer side of the main flow region;

in the cavity, a second kind of column is disposed, the second kind of column has a columnar shape, is located on an inner side of the main flow region, and reaches the top surface from the bottom surface;

a plurality of the first kind of columns is disposed in the cavity; and when viewed from the normal direction, a sectional area of the second kind column is smaller than a sectional area of at least two of the plurality of the first kind of columns.

18. The manufacturing method of the radio-frequency member of claim 12, wherein an opening area of the overflow is about 85% or more and about 100% or less of an opening area of the gate.

19. The manufacturing method of the radio-frequency member of claim 12, wherein in the cavity, one or a plurality of a first kind of columns are disposed, the first kind of columns has a columnar shape, reaches the top surface from the bottom surface, and has an outer diameter larger than width of the rod forming holes when viewed from the normal direction;

at least one of the first kind of columns is partially located on an outer side of the main flow region, or at least one of the first kind of columns is located entirely on the outer side of the main flow region;

an opening area of the overflow is about 85% or more and about 100% or less of an opening area of the gate;

in the cavity, a second kind of columns is disposed, the second kind of columns has a columnar shape, is located on an inner side of the main flow region, and reaches the top surface from the bottom surface is disposed;

a plurality of the first kind of columns is disposed in the cavity; and when viewed from the normal direction, a sectional area of the second kind of columns is smaller than a sectional area of at least two of the plurality of the first kind of columns.

20. The manufacturing method of the radio-frequency member of claim 12, wherein the functional-region section includes a ridge forming groove having length larger than depth thereof and width at the bottom thereof; and at least two of the rod forming holes are adjacent to the ridge forming groove.

21. A waveguide device comprising:

a plurality of radio-frequency members respectively manufactured by the manufacturing method of the radio-frequency member of claim 3;

a circuit board disposed on one or more of the plurality of radio-frequency members; wherein the functional-region section includes a ridge forming groove having length larger than depth thereof and width at the bottom thereof;

at least two of the rod forming holes are adjacent to the ridge forming groove;

one of the plurality of radio-frequency members includes a first conductive surface and a second conductive surface opposing an opposite direction of the first conductive surface;

another one of the plurality of radio-frequency members include a third conductive surface and a fourth conductive surface opposing an opposite direction of the third conductive surface;

in the cavity, the first conductive surface contacts the top surface and the second conductive surface contacts the bottom surface;

in the cavity, the third conductive surface contacts the top surface and the fourth conductive surface contacts the bottom surface; and one of the first conductive surface and the second conductive surface is opposed to one of the third conductive surface and the fourth conductive surface.

22. A waveguide device comprising:

a plurality of radio-frequency members respectively manufactured by the manufacturing method of the radio-frequency member of claim 3;

a circuit board disposed on one or more of the plurality of radio-frequency members; wherein the functional-region section includes a ridge forming groove having length larger than depth thereof and width at the bottom thereof;

at least two of the rod forming holes are adjacent to the ridge forming groove;

in the cavity, one or a plurality of a first kind of columns are disposed, the first kind of columns have a columnar shape, reach the top surface from the bottom surface, and have an outer diameter larger than width of the rod forming holes when viewed from the normal direction are disposed;

at least one of the first kind of columns is partially located on an outer side of the main flow region, or at least one of the first kind of columns is located entirely on the outer side of the main flow region;

one of the plurality of radio-frequency members includes a first conductive surface and a second conductive surface opposing an opposite direction of the first conductive surface;

another one of the plurality of radio-frequency members include a third conductive surface and a fourth conductive surface opposing an opposite direction of the third conductive surface;

in the cavity, the first conductive surface contacts the top surface and the second conductive surface contacts the bottom surface;

in the cavity, the third conductive surface contacts the top surface and the fourth conductive surface contacts the bottom surface; and one of the first conductive surface and the second conductive surface is opposed to one of the third conductive surface and the fourth conductive surface.

* * * * *